United States Patent
Karpas et al.

(10) Patent No.: US 11,605,235 B2
(45) Date of Patent: Mar. 14, 2023

(54) DETECTING ONE OR MORE OBJECTS IN AN IMAGE, OR SEQUENCE OF IMAGES, AND DETERMINING A CATEGORY AND ONE OR MORE DESCRIPTORS FOR EACH OF THE ONE OR MORE OBJECTS, GENERATING SYNTHETIC TRAINING DATA, AND TRAINING A NEURAL NETWORK WITH THE SYNTHETIC TRAINING DATA

(71) Applicant: LexSet.ai Inc., Brooklyn, NY (US)

(72) Inventors: Leslie Karpas, Los Angeles, CA (US); Francis Bitonti, Brooklyn, NY (US); Azam Khan, Seattle, WA (US)

(73) Assignee: LexSet.ai Inc., Brooklyn, NY (US)

( * ) Notice: Subject to any disclaimer, the term of this patent is extended or adjusted under 35 U.S.C. 154(b) by 35 days.

(21) Appl. No.: 17/145,041

(22) Filed: Jan. 8, 2021

(65) Prior Publication Data

US 2021/0133426 A1 May 6, 2021

Related U.S. Application Data

(63) Continuation of application No. 16/138,918, filed on Sep. 21, 2018, now Pat. No. 10,915,730.
(Continued)

(51) Int. Cl.
*G06V 20/64* (2022.01)
*G06T 19/20* (2011.01)
(Continued)

(52) U.S. Cl.
CPC .............. *G06V 20/64* (2022.01); *G06F 30/23* (2020.01); *G06K 9/6262* (2013.01);
(Continued)

(58) Field of Classification Search
CPC .......... G06V 20/64; G06V 20/20; G06T 7/80; G06T 7/73; G06T 7/13; G06T 19/20;
(Continued)

(56) References Cited

U.S. PATENT DOCUMENTS 8,708,223 B2  4/2014 Gates et al.
8,928,695 B2  1/2015 Fein et al.
(Continued)

FOREIGN PATENT DOCUMENTS

CN   106103861 A   11/2016
KR   20110132031 A   12/2011
(Continued)

OTHER PUBLICATIONS

International Bureau, "International Preliminary Report on Patentability from PCT Application No. PCT/US2018/052310", from Foreign Counterpart to U.S. Appl. No. 16/138,918, filed Apr. 2, 2020, pp. 1 through 14, Published: WO.
(Continued)

*Primary Examiner* — Michael R Neff
(74) *Attorney, Agent, or Firm* — Volpe Koenig

(57) ABSTRACT

In an embodiment, an image-capture system, includes an image-capture device and computing circuitry. The image-capture device is configured to capture an image of a region of space that includes an object. And the computing circuitry is coupled to the image-capture device and is configured to detect a representation of the object in the image, to determine a representation of a boundary of the detected representation, to provide image information corresponding to the detected representation to an image-analysis system, to receive, from the image-analysis system, an identifier of a category to which the object belongs, and a descriptor of the object, and to generate a representation of a list that includes the identifier and the descriptor.

27 Claims, 9 Drawing Sheets

Related U.S. Application Data

(60) Provisional application No. 62/561,295, filed on Sep. 21, 2017.

(51) Int. Cl.
| | | |
|---|---|---|
| *G06N 3/084* | (2023.01) | |
| *G06T 7/13* | (2017.01) | |
| *G06T 7/73* | (2017.01) | |
| *G06T 7/80* | (2017.01) | |
| *G06K 9/62* | (2022.01) | |
| *G06N 3/08* | (2023.01) | |
| *G06N 3/04* | (2023.01) | |
| *G06F 30/23* | (2020.01) | |
| *G06V 20/20* | (2022.01) | |

(52) U.S. Cl.
CPC ......... *G06K 9/6274* (2013.01); *G06N 3/0454* (2013.01); *G06N 3/08* (2013.01); *G06N 3/084* (2013.01); *G06T 7/13* (2017.01); *G06T 7/73* (2017.01); *G06T 7/80* (2017.01); *G06T 19/20* (2013.01); *G06V 20/20* (2022.01); *G06T 2207/20081* (2013.01)

(58) Field of Classification Search
CPC ......... G06T 2207/20081; G06F 30/23; G06K 9/6262; G06K 9/6274; G06N 3/0454; G06N 3/08; G06N 3/084
See application file for complete search history.

(56) References Cited

U.S. PATENT DOCUMENTS

| | | | |
|---|---|---|---|
| 8,941,689 B2 | 1/2015 | Fein et al. | |
| 8,959,082 B2 | 2/2015 | Davis et al. | |
| 9,077,647 B2 | 7/2015 | Fein et al. | |
| 9,105,126 B2 | 8/2015 | Fein et al. | |
| 9,111,383 B2 | 8/2015 | Fein et al. | |
| 9,111,384 B2 | 8/2015 | Fein et al. | |
| 9,141,118 B2 | 9/2015 | Yang et al. | |
| 9,141,188 B2 | 9/2015 | Fein et al. | |
| 9,170,656 B2 | 10/2015 | Gates et al. | |
| 9,230,261 B2 | 1/2016 | Gates et al. | |
| 9,235,571 B2 | 1/2016 | Gerrity et al. | |
| 9,317,950 B2 | 4/2016 | Chan et al. | |
| 9,448,623 B2 | 9/2016 | Fein et al. | |
| 9,477,864 B2 | 10/2016 | Gerrity et al. | |
| 9,569,439 B2 | 2/2017 | Davis et al. | |
| 9,665,800 B1 * | 5/2017 | Kuffner, Jr. | G06V 20/653 |
| 9,671,863 B2 | 6/2017 | Fein et al. | |
| 9,674,047 B2 | 6/2017 | Fein et al. | |
| 9,734,369 B2 | 8/2017 | Gerrity et al. | |
| 9,734,614 B2 | 8/2017 | Chan et al. | |
| 10,007,820 B2 | 6/2018 | Gerrity et al. | |
| 10,019,654 B1 | 7/2018 | Pisoni | |
| 2013/0106682 A1 | 5/2013 | Davis et al. | |
| 2013/0106683 A1 | 5/2013 | Davis et al. | |
| 2013/0106893 A1 | 5/2013 | Davis et al. | |
| 2013/0106894 A1 | 5/2013 | Davis et al. | |
| 2013/0110804 A1 | 5/2013 | Davis et al. | |
| 2013/0127893 A1 | 5/2013 | Gokturk et al. | |
| 2013/0135332 A1 | 5/2013 | Davis et al. | |
| 2014/0091829 A1 | 4/2014 | Yamayose et al. | |
| 2014/0098133 A1 | 4/2014 | Fein et al. | |
| 2014/0098136 A1 | 4/2014 | Fein et al. | |
| 2014/0098137 A1 | 4/2014 | Fein et al. | |
| 2014/0307129 A1 | 10/2014 | Feng | |
| 2015/0269746 A1 | 9/2015 | Chan et al. | |
| 2016/0225053 A1 | 8/2016 | Romley et al. | |
| 2017/0083752 A1 | 3/2017 | Saberian et al. | |
| 2017/0154302 A1 | 6/2017 | Streebin et al. | |
| 2017/0169620 A1 * | 6/2017 | Bleiweiss | G06V 20/64 |
| 2017/0220887 A1 | 8/2017 | Fathi et al. | |
| 2017/0315613 A1 | 11/2017 | Fein et al. | |
| 2017/0345199 A1 | 11/2017 | Chan et al. | |
| 2017/0357844 A1 * | 12/2017 | Comaniciu | G16H 50/20 |
| 2018/0077376 A1 * | 3/2018 | Armeni | G06T 19/20 |
| 2018/0260843 A1 | 9/2018 | Hiranandani et al. | |
| 2019/0102601 A1 | 4/2019 | Karpas et al. | |

FOREIGN PATENT DOCUMENTS

| | | |
|---|---|---|
| KR | 20140077066 A | 6/2014 |
| WO | 2014126998 A1 | 8/2014 |
| WO | 2015143130 A1 | 9/2015 |

OTHER PUBLICATIONS

International Searching Authority, "International Search Report and Written Opinion from PCT Application No. PCT/US2018/052310 dated Mar. 4, 2019", from Foreign Counterpart to U.S. Appl. No. 16/138,918, pp. 1-18, Published: WO.

U.S. Patent and Trademark Office, "Office Action", U.S. Appl. No. 16/138,918, dateds Mar. 13, 2020, pp. 1-28, Published: US.

U.S. Patent and Trademark Office, "Notice of Allowance", U.S. Appl. No. 16/138,918, dated Oct. 6, 2020, pp. 1 through 11, Published: US.

* cited by examiner

DETECTING ONE OR MORE OBJECTS IN AN IMAGE, OR SEQUENCE OF IMAGES, AND DETERMINING A CATEGORY AND ONE OR MORE DESCRIPTORS FOR EACH OF THE ONE OR MORE OBJECTS, GENERATING SYNTHETIC TRAINING DATA, AND TRAINING A NEURAL NETWORK WITH THE SYNTHETIC TRAINING DATA

PRIORITY CLAIM(S) AND RELATED PATENT APPLICATION(S)

The present patent application is a continuation of U.S. Non-Provisional patent application Ser. No. 16/138,918, titled DETECTING ONE OR MORE OBJECTS IN AN IMAGE, OR SEQUENCE OF IMAGES, AND DETERMINING A CATEGORY AND ONE OR MORE DESCRIPTORS FOR EACH OF THE ONE OR MORE OBJECTS, GENERATING SYNTHETIC TRAINING DATA, AND TRAINING A NEURAL NETWORK WITH THE SYNTHETIC TRAINING DATA, which was filed 21 Sep. 2018, which is incorporated by reference herein, and which claims priority to U.S. Provisional Patent App. Ser. No. 62/561,295, titled SEMANTIC WEBS FOR 3D CAD DATA AND KINEMATIC, which was filed 21 Sep. 2017, and which is incorporated by reference herein.

SUMMARY

Choosing furniture and other décor for a space can be expensive and time-consuming, particularly for one having little or no interior-design or interior-decorating experience.

For example, if an inexperienced person wishes to add one or more items of furniture to a space, or to refurnish a space, then he/she typically spends countless hours visiting brick-and-mortar furniture stores, or perusing online furniture catalogues, to learn the types of furniture styles (e.g., contemporary, art deco, rustic) and the respective items of furniture (e.g., tables, chairs, sofas, entertainment centers, armoires) in each style, and to determine the style of the furniture currently in the space or to decide in what style and with what items he/she wishes to refurnish the space. And determining an overall style of furniture in a space in which the items of furniture do not all have the same style can be particularly challenging to an inexperienced person.

Alternatively, the inexperienced person may hire an interior decorator or interior designer at a significant cost in addition to the cost of the furniture. And even the interior designer may need to spend significant time visiting brick-and-mortar furniture stores or perusing online furniture catalogues with his/her client to show the client what furniture styles and items are available.

Therefore, a need has arisen for a technique that reduces the time and cost for both inexperienced consumers and experienced interior designers and decorators to furnish or to refurnish, and otherwise to decorate or redecorate, a space.

An embodiment of a system that allows a reduction in the time and cost to furnish, refurnish, decorate, or redecorate a space includes an image-capture subsystem and an image-analysis subsystem. The image-capture subsystem includes first computing circuitry configured to detect a representation of an object (e.g., an item of furniture) in an image of a space (e.g., a common area of an apartment building). And the image-analysis subsystem includes second computing circuitry configured to determine, in response to image information corresponding to the detected representation (e.g., the pixels that form at least a portion of the detected representation), a category (e.g., chair) to which the object belongs, and at least one descriptor (e.g., color, style) of the object.

For example, assume that the image-capture subsystem is disposed on a smartphone, and that the image-analysis subsystem is disposed on one or more cloud servers.

A customer captures, with the smartphone's camera, a video sequence of frames (hereinafter "images"), of a space that includes one or more items of furniture. For example, the customer may be a person having little or no experience with interior design or decoration, or may be an experienced interior designer or decorator.

For each image, the smartphone detects the items of furniture, generates a respective bounding box for each detected item of furniture, and sends the respective set of pixels that represents at least a portion of each detected item of furniture to the cloud.

In response to each set of pixels, the one or more cloud servers determine a respective category, and a respective one or more descriptors, for a corresponding one of the detected items of furniture, and return, to the smartphone, the determined categories and descriptors.

The smartphone displays each image, and, for each detected item of furniture, displays the respective bounding box, category, and descriptor(s) overlaying the image and "anchored" to the item of furniture. Herein, "anchored" means that the bounding box is displayed around at least a portion of the furniture item, and that the category and descriptor(s) are displayed adjacent to the furniture item in a manner that conveys, to a viewer, that the category and descriptor(s) correspond to the furniture item. For example, the image may include a tag that points to the furniture item to which a list of the category and the other descriptor(s) is anchored.

Alternatively, the smartphone can display, for each detected item of furniture, the respective bounding box, category, and other descriptor(s) overlaying an image captured subsequent to the image that includes the set of pixels; overlaying a subsequent image with the bounding box(es), category(ies), and other descriptor(s) typically is due to a combined delay (e.g., one to five video images) of the smartphone and the one or more cloud servers in generating the representation(s) of the boundary and in determining the category(ies) and one or more other descriptors. That is, the combined delay is such that the smartphone and one or more cloud servers do not generate the boundary, category, and other descriptor(s) fast enough for the smart phone to display them over the image including the pixel representation of the item from which the boundary, category, and descriptor(s) are determined.

Although described above in terms of light-based images of items of furniture in a living or work space, one or more embodiments apply to, and can be used for or with, other types of images, other types of objects, and other types of spaces. For example, one or more embodiments apply to other types of images (e.g., sonographs, infrared images), other types of spaces (e.g., outdoors, outer space, underwater), and other types of objects (e.g., buildings, trees, planets, water craft) in a space.

In another embodiment, the image-analysis subsystem resides (e.g., is run or implemented by) a non-cloud server.

In yet another embodiment, one or both of the image-capture subsystem and the image-analysis subsystem each run a respective one or more neural networks.

Yet another embodiment is method for training the one or more neural networks.

Still another embodiment is directed to generating synthetic training images for training the one or more neural networks. That is, the training images are constructed and are not merely captured images that are marked up to show objects.

In an embodiment, an image-capture subsystem, includes an image-capture device and computing circuitry. The image-capture device is configured to capture an image of a region of space that includes an object. And the computing circuitry is coupled to the image-capture device and is configured to detect a representation of the object in the image, to determine a representation of a boundary of the detected representation, to provide image information corresponding to the detected representation to an image-analysis system, to receive, from the image-analysis system, an identifier of a category to which the object belongs, and a descriptor of the object, and to generate a representation of a list that includes the identifier and the descriptor.

In another embodiment, an image-capture-and-analysis system includes first computing circuitry and second computing circuitry. The first computing circuitry is configured to detect a representation of an object in a first image. And the second computing circuitry is configured to determine, in response to image information corresponding to the detected representation, a category to which the object belongs, and a descriptor of the object.

In yet another embodiment, an image-analysis subsystem includes computing circuitry configured to receive a portion of an image, the portion representing an object, and to implement a tree of neural networks configured to determine, in response to the portion of the image, a category and a descriptor corresponding to the object.

Another embodiment is a method for training at least one neural network and includes the following. Generating respective image segments of each of one or more objects (e.g., items of furniture) in response to respective electronic representations (e.g., three-dimensional computer-aided-design electronic files) of the one or more objects. Combining a respective image segment of each of at least one of the one or more objects with an image of a space (e.g., a room in a house or other building) to generate a first combined (e.g., synthetic training) image of the objects in the space. Changing at least one parameter of the first combined image to generate a second combined (e.g., synthetic training) image of the objects in the space. And training at least one neural network with the first and second combined images.

DETAILED DESCRIPTION

Each value, quantity, or attribute herein preceded by "substantially," "approximately," "about," a form or derivative thereof, or a similar term, encompasses a range that includes the value, quantity, or attribute ±20% of the value, quantity, or attribute, or a range that includes ±20% of a maximum difference from the value, quantity, or attribute. For example, "two planes are approximately orthogonal to one another" encompasses an angle $72° \leq \alpha \leq 108°$ between the two planes ($|90°|$ is the angular difference between the two planes when they are orthogonal to one another, and ±20% of $|90°|$ is ±18°).

Furthermore, any described function, operation, or functional block is performed by a circuit configured to perform the function or operation, or to implement the functional block. Such a circuit, and any other disclosed, can be so configured by executing software instructions, in response to configuration data (e.g., firmware), or by hard-wired connections.

Figure 1:
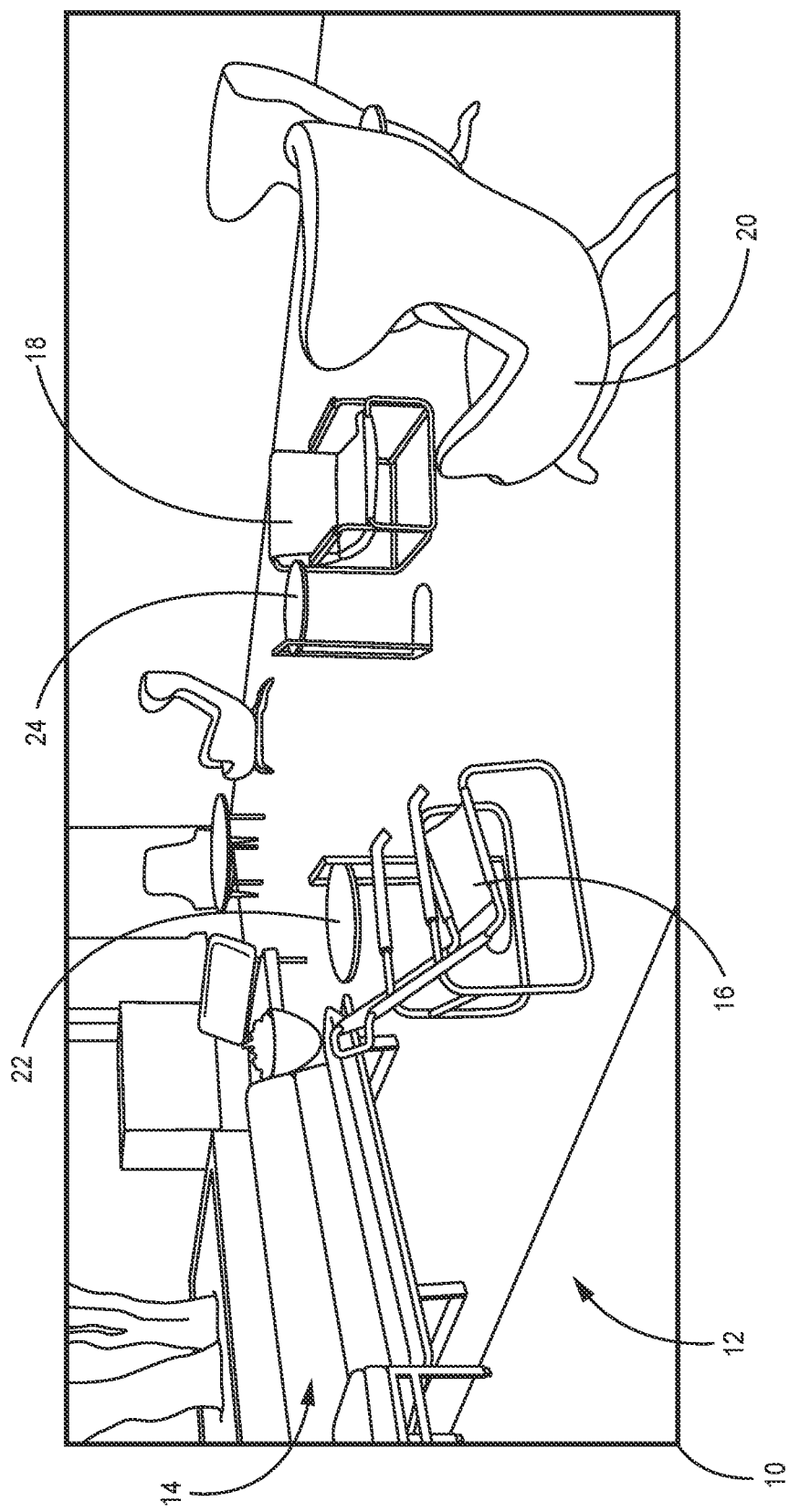
FIG. 1 is an image of a region of a space that includes one or more items of furniture.

FIG. 1 is a two-dimensional image 10 of a region of a space 12, which here is a room that includes one or more items of furniture. For example, the space 12 includes a sofa 14, chairs 16, 18, and 20, and tables 22 and 24. Although the image 10 is light image of the space 12 (i.e., the pixels of the image represent attributes of light, such as intensity and color, reflected from objects within the space), which includes items of furniture, the below description applies to other types of images (e.g., sonographs, infrared images), other types of spaces (e.g., outdoors, outer space, underwater), and other types of objects (e.g., buildings, trees, planets, water craft) in a space.

The image 10 was captured by an image-capturing subsystem, which is not shown in FIG. 1 but which is described below in conjunction with FIGS. 5-7. Examples of the image-capturing subsystem include a smartphone or tablet computer that incorporates a still-image or video camera, or a still-image or video camera electrically and communicatively coupled to a laptop, desktop, or other computer system or computer circuitry.

If a person inexperienced in interior design and interior decorating wishes to replace some or all of the furniture in the space 12, then he/she typically would spend many hours researching decorating styles and themes, furniture styles (e.g., rustic, American artisan, art deco), furniture types (e.g., chair, sofa, table), and furniture items (e.g., specific furniture pieces by stock-keeper units (SKUs)) online and in brick-and-mortar furniture stores.

Alternatively, the person could hire, at a significant cost, an experienced interior designer or interior decorator to research and propose a decorating theme, a furniture style, and furniture items for the space 12.

Although hiring an interior designer or decorator would tradeoff a savings in time for an added expense, the person would still need to spend a significant amount of time working with the interior designer or decorator to select a decorating theme, furniture style, and specific furniture items.

Described below in conjunction with FIGS. 2-9 is a system that can help a person inexperienced in interior design and interior decorating to perform one or more of the above tasks in a shorter amount of time and without the expense of an experienced interior designer or decorator. And such a system also can help an experienced interior designer or decorator perform one or more of the above tasks in a shorter amount of time.

Figure 2:
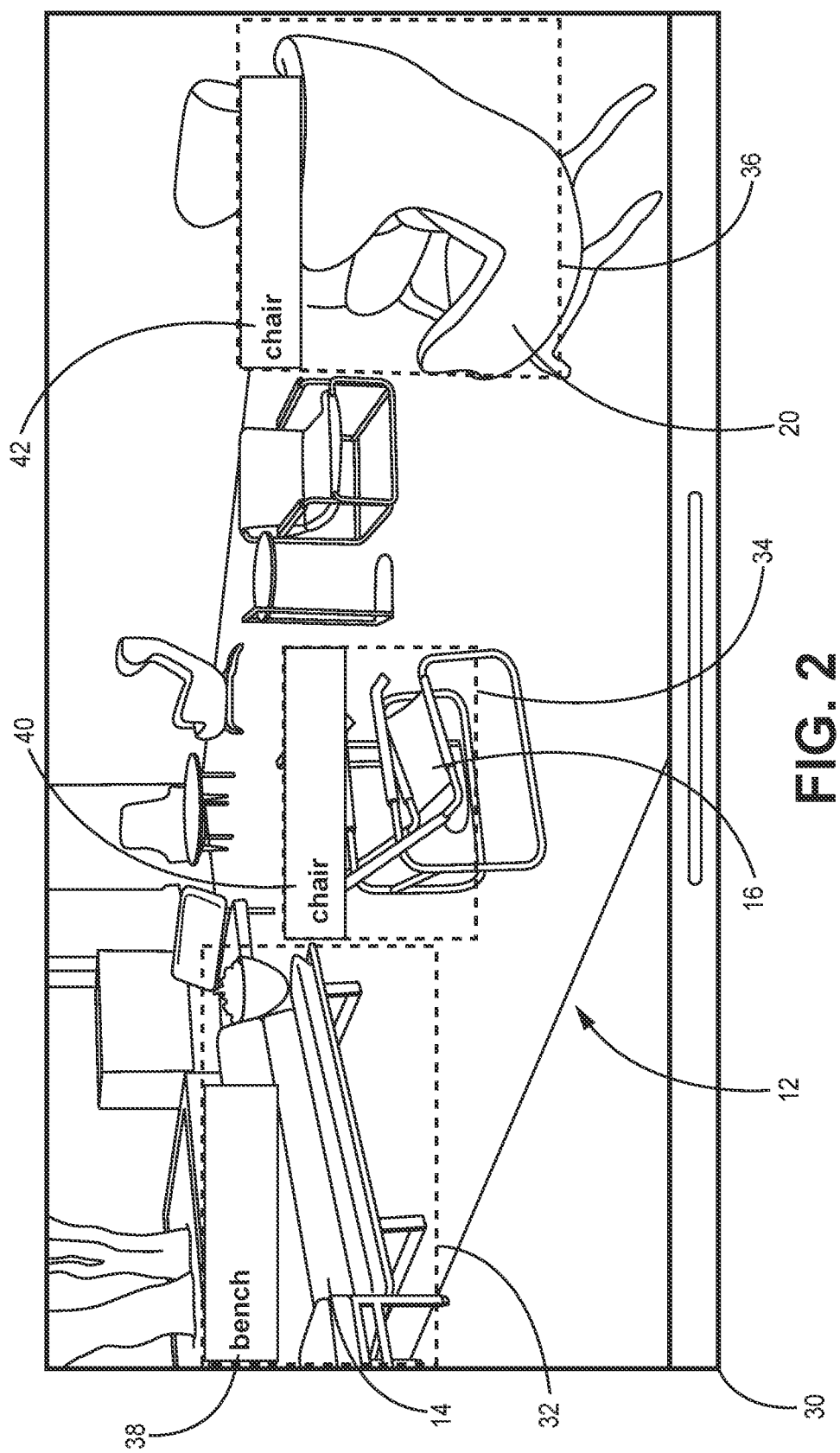
FIG. 2 is an image of same region of space as in the image of FIG. 1, and the image is overlaid with bounding boxes and category names for some of the items of furniture, according to an embodiment.

FIG. 2 is an image 30 of a region of the space 12 of FIG. 1, where the system (not shown in FIG. 2) generates, and lays over the image, bounding boxes 32, 34, and 36, and category names 38, 40, and 42, for the sofa 14, the chair 16, and the chair 20, respectively, according to an embodiment.

Each bounding box bounds all, or at least a major portion of, a respective object in the image 30. For example, the bounding box 32 includes, within its interior, almost the entire sofa 14, the bounding box 34 includes the seat and back, but excludes portions of the legs, of the chair 16, and the bounding box 36 includes most of the seat and back, but excludes most of the legs, of the chair 20.

And the category names (e.g., "sofa," "chair," and "chair") serve to identify the type of the furniture item.

Figure 3:
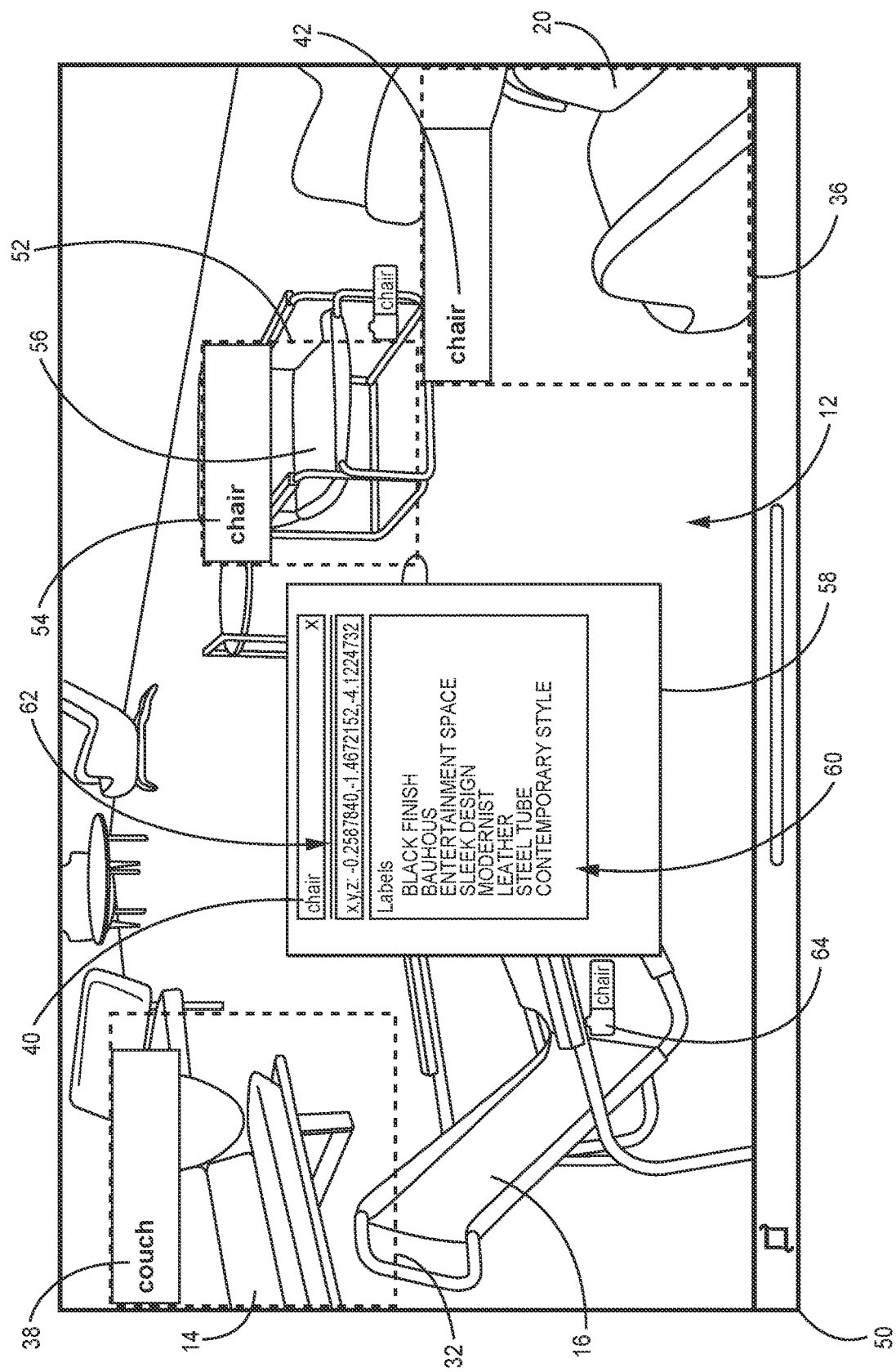
FIG. 3 is an image of the same region of space as in the image of FIGS. 1 and 2, wherein the image is overlaid with bounding boxes and category names for some of the items of furniture, and overlaid with a list of the category name and descriptors for another of the items of furniture, according to an embodiment.

FIG. 3 is an image 50 of a region of the space 12 of FIGS. 1 and 2, where the system (not shown in FIG. 3) generates, and lays over the image, the bounding boxes 32 and 36 and the category names 38 and 42 for the sofa 14 and the chair 20, respectively, a bounding box 52 and a category name 54 for a chair 56, and a list 58 including the category name 40, other descriptors 60 (the category name also can be considered one of the descriptors), and a relative location 62 for the chair 16, according to an embodiment. For example, the relative location 62 can be a center point of the bounding box 34 (FIG. 2) for the chair 16, can be a center of mass of the bounding box, or can be a center of a three-dimensional representation of the chair that the system generates and stores.

The list 58 is anchored to the chair 16 with an anchor icon 64, and each of the descriptors 60 describes a style or another attribute of the chair. For example, the descriptors 60 indicate that the chair 16 is of a contemporary style, has a black finish, a sleek design, nail-head trim, is paired, in the space 12, with a Persian rug and an end table 64 that can support a table lamp (not shown in FIG. 3), and is suitable for use in an entertainment space and in a breakfast nook. The system (not shown in FIG. 3) is able to indicate that the chair 16 is paired with a Persian rug and an end table 64 because the system also detected, categorized, and described (with descriptors) these items.

A person can use the list 58 in a number of ways.

For example, he/she can perform a manual search in brick-and-mortar furniture stores, in paper catalogues, or online for chairs that have the same style, and that have one or more of the same, or similar, attributes as indicated by the other descriptors 60.

Alternatively, the system can be configured to perform, automatically or at the request of the person, an online search for chairs that have attributes the same as, or similar to those, indicated by the descriptors 60. And the person can weight the influence of the descriptors 60 on the search in response to spatial information regarding the space 12. For example, one may want a large item of furniture (e.g., a large banquet table) in the center of the space 12 to dictate the style and the other characteristics of furniture in the space. Therefore, for purposes of the search, the one can weight the descriptors for the large item of furniture more heavily than the descriptors of the other items of furniture in the space so that the search tends to return items of furniture having descriptors that trend closer to the descriptors of the large item of furniture than they do to the descriptors of the other items of furniture.

In another alternative, the person or the system can upload the list 58 to a furniture provider's webserver, which then returns a list of all of the provider's furniture items having attributes that match the attributes indicated by the descriptors 60. The person, or the furniture provider's webserver, can adjust, in a conventional manner, the level of similarity between the attributes of a furniture item and the attributes indicated by the descriptors 60 needed to yield a match.

Still referring to FIGS. 2-3, alternate embodiments of the image-capture-and-analysis system (not shown in FIGS. 2-3), and methods that the system is configured to perform, are contemplated. For example, the shapes of one or more of the bounding boxes 32, 34, 36, and 52 can be other than rectangular (e.g., circular, triangular). Furthermore, the system can display one or more of the bounding boxes 32, 34, 36, and 52 without the corresponding category names 38, 40, 42, and 54 or list 58; conversely, the system can display one or more of the category names or list without the corresponding bounding box. Moreover, the system can capture and display a video sequence of images of the space 12, even as the system camera moves (e.g., pans across the space), and the system can display one or more of bounding boxes, category names, and lists in each of the images such that the one or more bound boxes, category names, and lists each "follows" its respective object as the camera moves. The system can do this by determining one or more of a bounding box, category name, and a list for each item of furniture in each image. Alternatively, the system can generate a three-dimensional map (i.e., point cloud) of the space 12, determine a respective centroid for each item of furniture, track the respective relative locations of each item of furniture from image to image, and, for each item of furniture, the system can display a previously determined bounding box centered about the centroid of a respective item of furniture. For example, the system may track the relative locations in response to one or more sensors onboard the camera, where each sensor generates a respective signal including information (e.g., acceleration, GPS location) related to the movement of the camera. In yet another alternative, the system can determine the bounding box of a furniture item in one image and display the bound box at the same location in a subsequent image. As long as the subsequent image is not too distant, in time, from the one image, and the camera does not move too great of a distance from the time that the system captures the one image to the time that the system captures the subsequent image, the bounding box will at least approximately bound the furniture item in the subsequent image such that any misalignment is barely noticeable to a viewer.

Figure 4:
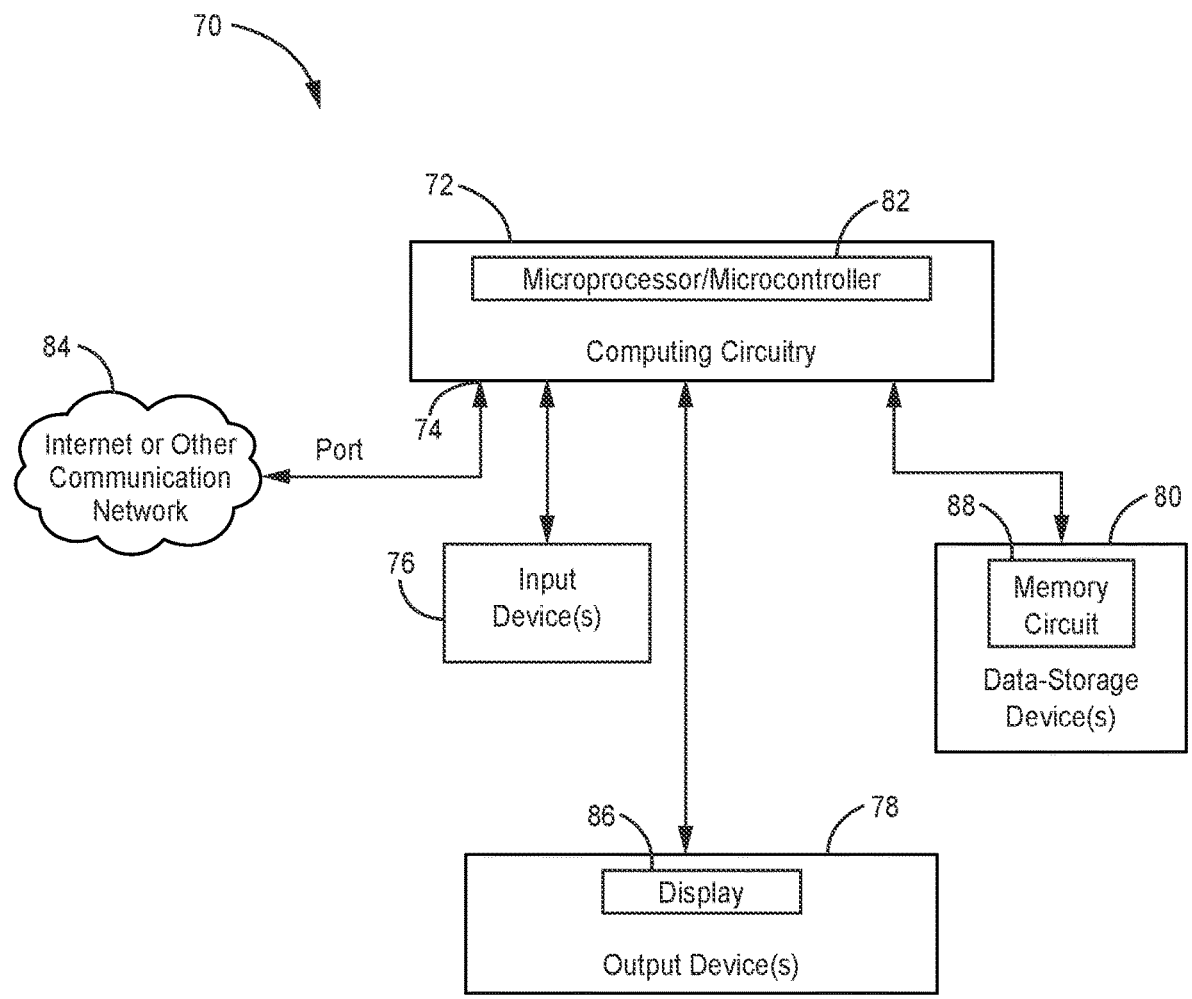
FIG. 4 is a circuit diagram of an image-analysis subsystem and of a network via which the subsystem can communicate with a remote device, subsystem, or system, according to an embodiment.

FIG. 4 is a circuit diagram of an image-analysis subsystem 70 of the image-capture-and-analysis system described above in conjunction with FIGS. 2-3 and below in conjunction with FIGS. 6-8, according to an embodiment.

The image-analysis subsystem 70 is configured to analyze images of spaces, to detect objects, such as furniture items, in the images, and to determine categories and other descriptors for the detected objects as described above in conjunction with FIGS. 2-3 and below in conjunction with FIGS. 5-8.

The image-analysis subsystem 70 includes computing circuitry 72, at least one communication port 74, one or more input devices 76, one or more output devices 78, and one or more data-storage devices 80.

The computing circuitry 72 includes one or more computing circuits, such as a microprocessor or microcontroller 82, or a field-programmable-gate array (FPGA), and is configured to execute program instructions, to be topologically configured in response to configuration data (e.g., firmware), and to implement data and software architectures in response to the program instructions, the configuration data, or both the program instructions and configuration data. For example, the computing circuitry 72 can be configured to implement one or more neural networks (NNs) as described below in conjunction with FIGS. 6-8.

The communication port 74 is configured to allow bidirectional communication between a device, subsystem, or system (not shown in FIG. 4) remote from the subsystem 70, and the computing circuitry 72 and other circuits and components of the subsystem 70 via a communications network 84 such as the internet or a cellular network. For example, the port 74 can be a wired port (e.g., Ethernet, Universal Serial Bus (USB)) or a wireless port (e.g., BlueTooth®, WiFi®) configured to communicate with an image-capture subsystem (see FIG. 5) as described above in conjunction with FIGS. 2-3 and below in conjunction with FIGS. 6-8.

Each of the one or more input devices 76 is configured to generate or to acquire information, and to provide the information to the computing circuitry 72. Examples of an input device 76 include a still-image camera or a video camera respectively configured to capture an image or a video sequence or series of images, a motion sensor (e.g., an accelerometer or GPS locator circuit) configured to generate data related to a movement or a location of the image-analysis subsystem 70, and a key pad configured to allow one to generate or to input, manually, commands, data, etc.

Each of the one or more output devices 78 is configured to receive and to consume information from the computing circuitry 72. Examples of an output device 78 include an image display device 86, a printer, and a speaker.

And each of the one or more data-storage devices 80 is configured to store data in a volatile or non-volatile manner. Examples of the data-storage devices 80 include a memory circuit 88 (e.g., a volatile memory circuit such as random-access memory (RAM), static RAM (SRAM), or dynamic RAM (DRAM), a non-volatile memory circuit such as electrically erasable and programmable read-only memory (EEPROM)), a magnetic-disk drive, a solid-state drive, and an optical-disk drive (e.g., a digital-versatile disk (DVD)). For example, one or more of the data-storage devices 80 can implement one or more databases for the image-analysis subsystem 70, can store program instructions of one or more software applications for execution by the computing circuitry 72, can store configuration data (e.g., firmware) for configuring the computing circuitry (e.g., FPGA circuitry), and can serve as volatile working memory for the computing circuitry.

In an operative example of the image-analysis subsystem 70, the computing circuitry 72 receives, via the port 74, image information regarding objects detected in images by an image-capture subsystem (see FIG. 5), determines a respective category and respective other descriptors for each object, and provides the determined categories and other descriptors to the image-capture subsystem via the port.

In a further operative example, the image-analysis subsystem 70 generates training images from electronic representations of objects, implements one or more neural networks, trains the neural networks with the training images, and stores the electronic representations of objects in a database for comparing to objects that the image-analysis subsystem categorizes and otherwise describes as described above in conjunction with FIGS. 2-3 and below in conjunction with FIGS. 6-8.

Still referring to FIG. 4, alternate embodiments of the image-analysis subsystem are contemplated. For example, the subsystem 70 can include one or more circuit or other components not disclosed above or shown in FIG. 4, and can omit one or more of the components disclosed above in conjunction with, or shown, in FIG. 4.

Figure 5:
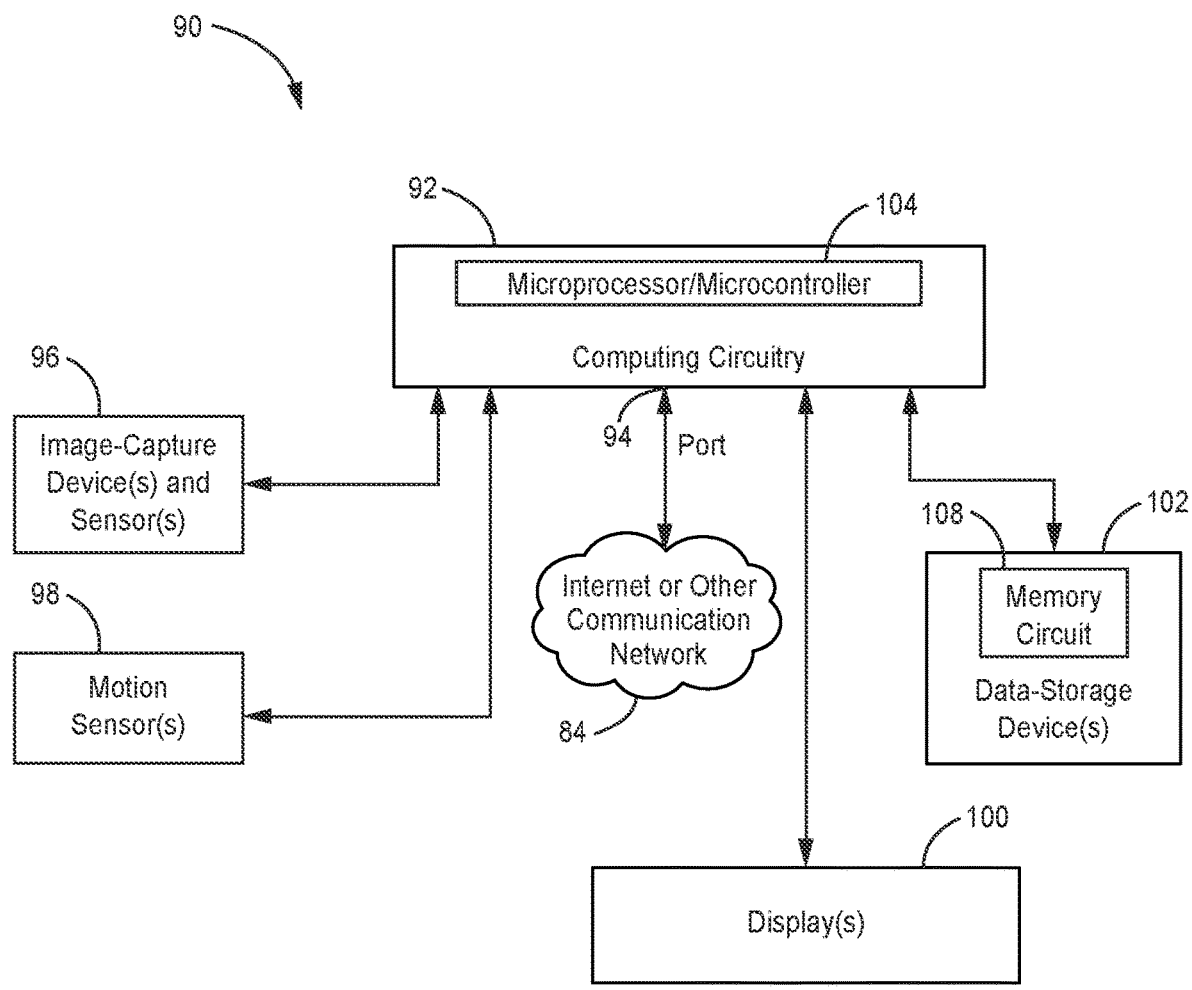
FIG. 5 is a circuit diagram of an image-capture subsystem and of a network via which the subsystem can communicate with a remote device, subsystem, or system, according to an embodiment.

FIG. 5 is a circuit diagram of an image-capture subsystem 90 of the image-capture-and-analysis system described above in conjunction with FIGS. 2-3 and below in conjunction with FIGS. 6-9, according to an embodiment.

The image-capture subsystem 90 is configured for use by an individual inexperienced in interior design and interior decorating, or by an interior designer or interior decorator of whom the individual is a client, to take one or more images (e.g., still images, a sequence of video images) of a space that the individual wishes to furnish, or in which the individual wishes to replace one or more items of existing furniture.

The image-capture subsystem 90 includes computing circuitry 92, at least one communication port 94, one or more image-capture devices and sensors 96, one or more motion sensors 98, one or more image display devices 100, and one or more data-storage devices 102.

The computing circuitry 92 includes one or more computing circuits, such as a microprocessor or microcontroller 104, or an FPGA, and is configured to execute program instructions, to be topologically configured in response to configuration data (e.g., firmware, data stream), and to implement data and software architectures in response to the program instructions, the configuration data, or both the program instructions and configuration data. For example, the computing circuitry 92 can be configured to implement one or more neural networks (NNs) as described below in conjunction with FIGS. 6-8.

The communication port 94 is configured to allow bidirectional communication between a device, subsystem, or system (not shown in FIG. 5) remote from the subsystem 90 and the computing circuitry 92 and other circuits and components of the subsystem via the communications network 84 such as the internet or a cellular network. For example, the port 94 can be a wired port (e.g., Ethernet, Universal Serial Bus (USB)), or a wireless port (e.g., BlueTooth®, WiFi®).

Each of the one or more image-capture devices and sensors 96 is configured to generate or to capture light images or other types (e.g., sound, infrared, thermal) of images, and to provide information (e.g., pixels) representing the images to the computing circuitry 92. For example, a still-image or video camera 96 is configured to capture a light image or a video sequence or series of light images, an array of microphones is configured to capture a sound image or a video sequence or series of sound images, and a thermal sensor is configured to capture a heat or infrared image or a video sequence or series of heat or infrared images.

Each of the one or more motion sensors 98 (e.g., an accelerometer, gyroscope, or GPS locator circuit) is configured to generate data related to a movement or location of the image-capture subsystem 90.

Each of the one or more display devices 100 is configured to receive image data (e.g., a pixel map) from the computing circuitry 92, or directly from an image-capture device or image-capture sensor 96, and to display one or more images (e.g., a still image or a video sequence of images) in response to the image data.

And each of the one or more data-storage devices 102 is configured to store data in a volatile or non-volatile manner. Examples of the data-storage devices 102 include a memory circuit 108 (e.g., a volatile memory circuit such as random-access memory (RAM), static RAM (SRAM), or dynamic RAM (DRAM), a non-volatile memory circuit such as electrically erasable and programmable read-only memory (EEPROM)), a magnetic-disk drive, a solid-state drive, and an optical-disk drive (e.g., a digital-versatile disk (DVD)). For example, one or more of the data-storage devices 102 can implement one or more databases for the image-capture subsystem 90, can store program instructions of one or more software applications for execution by the computing circuitry 92, can store configuration data for configuring the computing circuitry, and can serve as volatile working memory for the computing circuitry.

Although not shown in FIG. 5, the image-capture subsystem 90 can also include one or more input devices configured for providing information to the computing circuitry 92, and one or more output devices for consuming data from the computing circuitry. An example of an input device (other than an image-capture device and image-capture sensor 96, and other than a motion sensor 98) is a key pad configured to allow one to generate, manually, e.g., commands or other input data, for the computing circuitry 92. And examples of an output device (other than a display device 100) include a printer, a speaker, and a haptic (e.g., vibratory) generator.

In an operative example of the image-capture subsystem 90, a camera 96 captures one or more images, and provides these images to the computing circuitry 92, which routes the images for display by a display device 100, which processes the images, and which sends one or more segments of the images to the image-analysis subsystem 70 of FIG. 4 (see also FIG. 6) via the port 94 and the internet 84. Alternatively, the camera 96 can be configured to send the captured one or more images directly to the display device 100 for display.

Still referring to FIG. 5, alternate embodiments of the image-analysis subsystem 90 are contemplated. For example, the subsystem 90 can include one or more circuit or other components not disclosed above or shown in FIG. 5, and can omit one or more of the components disclosed above in conjunction with, or shown, in FIG. 5.

Figure 6:
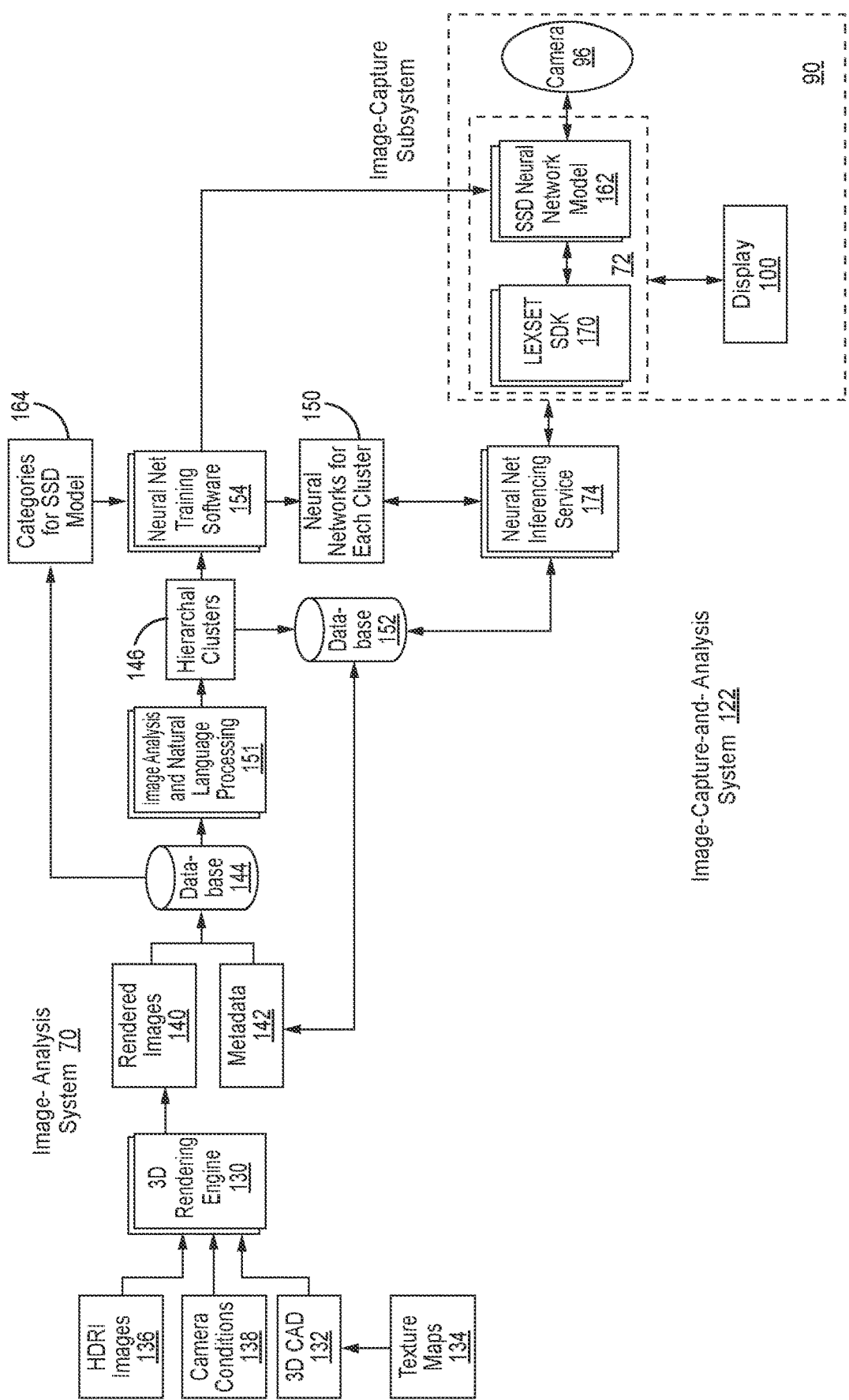
FIG. 6 is a combination circuit and flow diagram of a system that includes the image-analysis subsystem of FIG. 4 and the image-capture subsystem of FIG. 5, according to an embodiment.

FIG. 6 is a combination circuit and flow diagram 120 of an image-capture-and-analysis system 122, which includes the image-analysis subsystem 70 of FIG. 4 and the image-capture subsystem 90 of FIG. 5, according to an embodiment.

Figure 7:
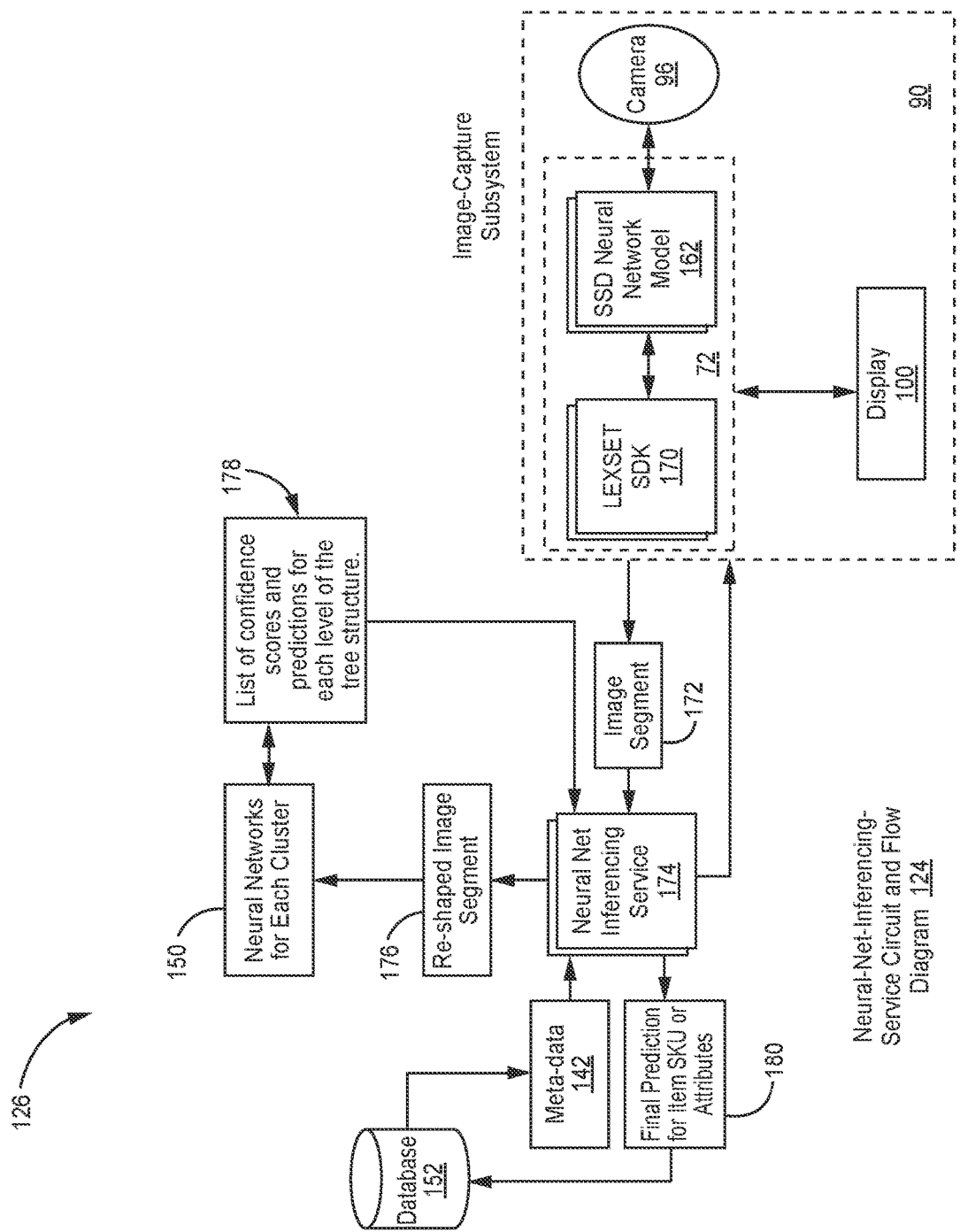
FIG. 7 is a combination circuit and flow diagram of a neural-net-inferencing-service portion of the system of FIG. 6, according to an embodiment.

FIG. 7 is a combination circuit and flow diagram 124 of a neural-net inferencing-service portion 126 of the image-analysis subsystem 70, and the image-capture subsystem 90, of the combination circuit and flow diagram 120 of FIG. 6, according to an embodiment.

Figure 8:
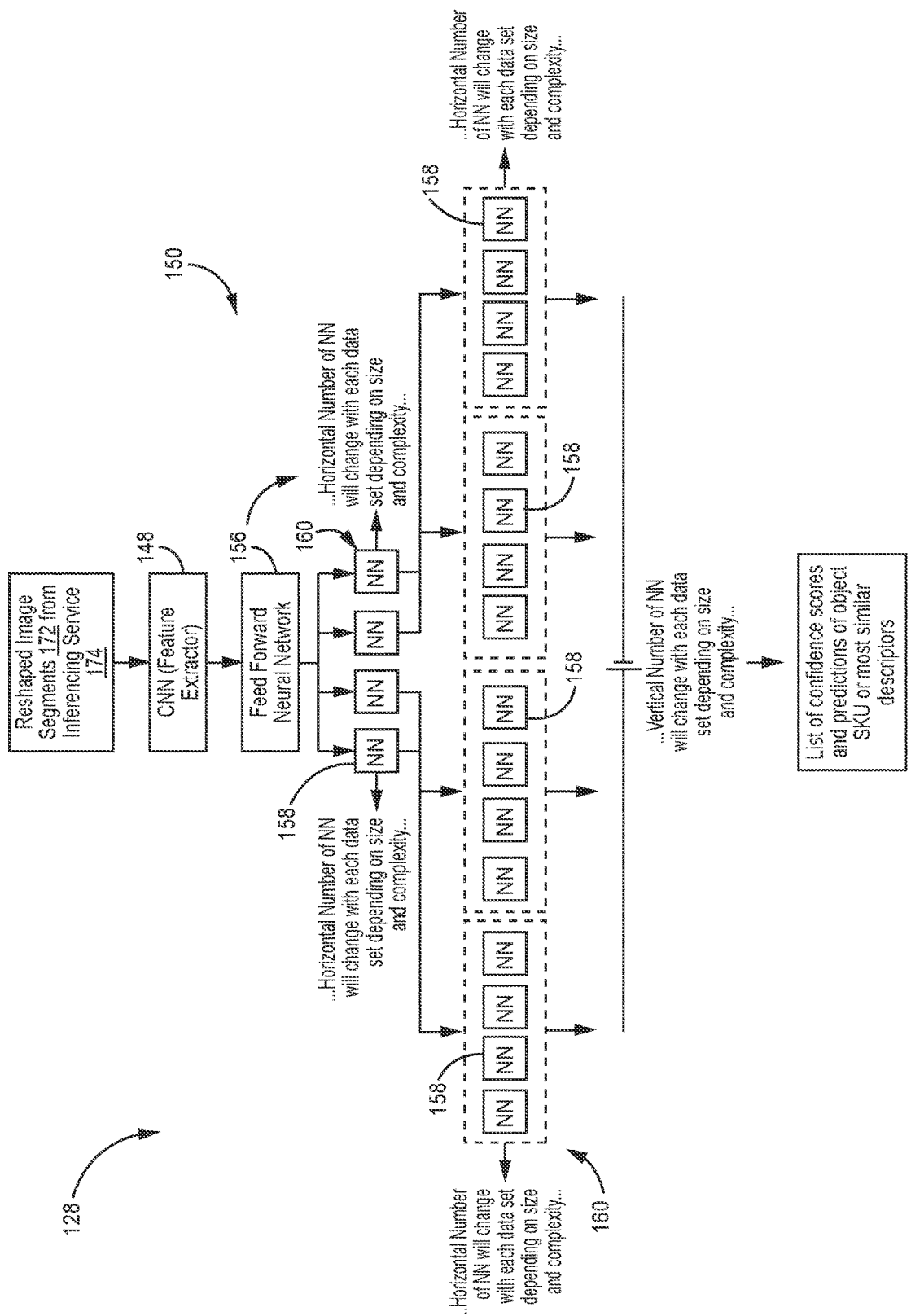
FIG. 8 is a combination circuit and flow diagram of a cluster-neural-network portion of the system of FIG. 6, according to an embodiment.

FIG. 8 is a combination circuit and flow diagram 128 of a cluster neural network 150 of the combination circuit and flow diagram 120 of FIG. 6, according to an embodiment.

The structure and operation of the image-capture-and-analysis system 122 of FIG. 6 during a neural-network training operation is described in conjunction with the combination circuit and flow diagrams 120, 124, and 128 of FIGS. 6-8, according to an embodiment.

First, the image-capture-and-analysis system 122 generates training images, according to an embodiment.

A 3D rendering engine circuit 130 receives a three-dimensional CAD (or other) representation 132 of an object, which is, for example an item of furniture such as a chair that is available for purchase from the furniture manufacturer or a furniture retailer. For example, the chair manufacturer may provide, as the 3D CAD representation of the chair, an electronic 3D CAD file of the chair, which the system 122 can store in a data-storage device 80 of FIG. 4. And the 3D CAD file may be configured to allow the circuit 130 to position a virtual representation of the chair into a number of different poses, hereinafter orientations. Although a chair is the object featured in following description, it is understood that the following description, and the principles included therein, can apply to any other item of furniture, and to any other object. Furthermore, the computing circuit 72 of FIG. 4 can be configured to be, or to implement, the 3D rendering engine circuit 130.

The 3D rendering engine circuit 130 also receives one or more texture maps 134 for the chair. For example, a seat of the chair may be available in wood (a first texture) or upholstered with leather (a second texture) or with a particular upholstery pattern (a third texture).

Next, the 3D rendering engine circuit 130 generates a number of versions of the chair in different orientations (one orientation per version), and having different textures (one texture per one chair portion per version). Furthermore, the circuit 130 is configured to add to the versions of the chair other real-world features such as fabric wrinkles, scratches, fabric tears, missing upholstery buttons, and stains. For example, the circuit 130 is configured to generate these versions randomly to obtain a statistically independent set of versions of the chair. The goal is to generate enough real-world versions of the chair to train the system so that the system will be able to recognize the chair in a variety of real-world settings.

Then, the 3D rendering engine circuit 130 repeats the above steps for one or more other items of furniture.

Next, the 3D rendering engine circuit 130 receives one or more high-dynamic-range (HDR) images 136 of empty spaces such as rooms or other areas in a house or other building in which one would expect to find items of furniture. The HDR images 136 lend themselves to adjusting the lighting conditions of the spaces in the images because an HDR image is, generally, a photon (i.e., a light-based) representation of a scene; therefore, the HDR images allow the circuit 130 to adjust lighting conditions of a space in an image by adjusting, e.g., the effective light-source location, color temperature, and light intensity, so as to represent a real-world lighting condition dependent upon these parameters.

The 3D rendering engine circuit 130 may also receive one or more camera conditions 138 (e.g., f-stop, shutter speed, color balance, white temperature) according to which the rendering engine circuit can further adjust the lighting conditions of the HDR images.

Then, the 3D rendering engine circuit 130 renders a number of training images 140 (e.g., one thousand or more) by populating the HDR images of spaces with one or more versions of the one or more pieces of furniture. The circuit 130 generates the training images randomly to obtain a statistically independent (i.e., a statistically diverse) spread of parameters such as types of spaces, number of furniture items in a space, furniture orientations, space lighting conditions, furniture textures, and other furniture features, to obtain training images that, as a set, represent an unbiased representation of all considered image and furniture-item parameters.

Next, the circuitry (e.g., the computing circuit 72 of FIG. 4) of the image-analysis subsystem 70 associates respective metadata 142 with each object in each of the rendered training images 140. For example, metadata 142 for an item of furniture includes, for example, a category (e.g., chair), one or more other descriptors (e.g., style, color, texture, size, material (e.g., metal, wood), finish), and an identifier such as an SKU. That is, for each item of furniture in each training image, the circuitry generates a list such as the list 58 of FIG. 3. The metadata 142 for an object may be included with the 3D CAD file 132 for the object, or the object manufacturer may provide the metadata in a file separate from the 3D CAD file. Furthermore, if, for example, items of furniture from different manufacturers have different categories or descriptor names, then one can reconcile the different categories and descriptor names to a set of common categories and descriptor names. For example, if one manufacturer has a category "couch" and another manufacturer has a corresponding category "sofa," then one can create a common category (e.g., "couch," "sofa," or davenport) and can convert the category for each sofa/couch to the common category. Further in example, if the metadata from one manufacturer has a descriptor (e.g., "leather upholstery") that the metadata from another manufacturer does not have, then the descriptor from the one manufacturer can be added to the metadata for a furniture item from the other manufacturer, where the added descriptor has, or effectively has, a value of null or zero.

Then, each of the rendered training images 140 and the respective associated metadata 142 are stored in a database 144, which may be disposed on one or more of the data-storage devices 80 of FIG. 4.

Next, the image-analysis subsystem 70 groups the objects (e.g., items of furniture) in the rendered training images 140 into hierarchal clusters 146 in the following manner.

Referring to FIG. 8, the subsystem 70 first trains a convolutional-neural-network (CNN) feature extractor 148 of neural networks 150 (FIG. 6) with the rendered training images 140.

For each object (e.g., item of furniture) in the training images 140, the synapse weightings of the CNN feature extractor 148 converge to a set of values over the course of the training.

Using a conventional comparison algorithm, the image-analysis subsystem 70 compares the sets of values for all of the objects to see which sets of synapse-weighting values are similar. For example, the subsystem 70 can indicate that two sets of synapse-weighting values are similar if the mean distance between the sets is below a particular threshold. In non-mathematical terms, objects with similar features (e.g., shape, contours, size) and metadata descriptors (e.g., category), as detected by the CNN feature extractor 148, tend to be in a same cluster, and objects with diverse features tend to be in different clusters.

The subsystem 70 groups all objects that yield similar sets of synapse-weighting values into a respective cluster. Where the objects are items of furniture, ideally a cluster includes all items of furniture of a same category. For example, ideally all chairs would be in a same cluster, all sofas in a same cluster, all tables in a same cluster, all lamps in a same cluster, etc. But this is not always the case. For example, both rectangular tables and flat-screen televisions have the prominent feature of a large, flat, smooth surface. Therefore, the image-analysis subsystem 70 may group rectangular tables and flat-screen televisions into a same cluster even though they are in different furniture categories. Similarly, the image-analysis subsystem 70 may group sofas and loveseats into a same cluster because they are typically similar but for length. Said another way, the subsystem 70 does not necessarily generate the same cluster groupings that a human might generate, and, therefore, cluster groupings that the subsystem 70 generates may seem strange, or even illogical, to a human not versed in neural-network theory.

Next, referring to FIG. 6, an image-analysis-and-natural-language-processing unit 151 associates, with each identified cluster 146, the metadata 142 for each object belonging to the cluster. For example, if an object belonging to a cluster is a sofa, then the unit 151 associates with the cluster all the metadata 142 (e.g., category "sofa" or "couch," other descriptors for color and texture) for that particular object. Sometimes, as described above, the correspondence between a cluster/category and objects may not be this "clean." For example, a clean correspondence, at least from a human perspective, might be that each cluster/category corresponds to a single respective type of furniture, like table, chair, and sofa. But as described in the previous paragraph, because it is the image-analysis subsystem 70 that determines the clusters, not a human, the correspondence between clusters and objects may not be "clean." For example, a cluster/category may be "item of furniture with large flat surface," which may include multiple furniture categories such as tables, flat-screen televisions, mirrors, large pictures, and desks. Further to this example, if an object belonging to such a multi-category cluster is a table, then the unit 151 associates with the cluster all metadata 142 (e.g., category "table", descriptors for size, color, distance from the floor) for that object. The image-analysis-and-natural-language-processing unit 151 can be the computing circuitry 72 (FIG. 4) configured by software or configuration data to perform the above functions, and any other functions described herein, that are attributed to the unit 151. If the cluster hierarchy includes cluster "trees" that include subclusters, then the unit 151 can also associate, with each identified subcluster, metadata 142 for each object belonging to the subcluster.

Then, the image-analysis subsystem 70 stores the cluster hierarchy and associated metadata 142 in a database 152. That is, the database 152 stores information identifying the clusters and identifying the object category(ies) (typically the metadata category names) belonging to each identified cluster, and the metadata 142 associated with all of the objects in each identified cluster. Furthermore, the databases 144 and 152 can be, or can be merged into, a same database.

Next, the image-analysis subsystem 70 trains the neural networks 150 for each cluster, and each subcluster within each cluster. For example, the computing circuitry 72 (FIG. 4) of the image-analysis subsystem 70 may train the neural networks 150 by executing neural-network training software 154, which implements a back-propagation training algorithm that can be conventional.

Referring to FIGS. 6 and 8, the image-analysis subsystem 70 uses the training images 140 to train the CNN feature extractor 148 to detect objects on the cluster level. That is, the subsystem 70 trains the CNN feature extractor 148 to generate, for each detected object, one or more confidence levels that are indicative as to which of the identified clusters the object belongs. For example, the subsystem 70 may train the CNN feature extractor 148 by feeding to the feature extractor the segments of a training image 140 that include the objects, one segment at a time.

And after the image-analysis subsystem 70 trains the CNN feature extractor 148, it uses the training images 140 to train respective feed-forward neural networks 156 to detect subclusters within each cluster; that is, there is one feed-forward neural network 156 per cluster. The subsystem 70 trains a respective feed-forward neural network 156 to generate one or more confidence levels that are indicative as to which subcluster an object belongs by generating the one or more confidence levels that are indicative of the metadata descriptors of the object. As described below, the feedforward network 156 may generate confidence levels corresponding to addresses of the database 152 containing the descriptors for the object.

Each feedforward neural network 156 includes a tree of neural networks 158, where the number of layers 160 (two layers shown in FIG. 8), and the number of neural networks 158 within each layer, can be different from neural network 156 to neural network 156. Using conventional mathematical techniques, the image-analysis subsystem 70 determines the number of layers 160 and the number of neural networks 158 within each of the layers in response to parameters such as the number of objects (e.g., items of furniture), also called "data sets," that belong to the cluster for which the feedforward neural network 156 is being trained, and the classification complexity (e.g., number of metadata descriptors an object in the cluster can have) of the cluster.

Each of the neural networks 158 is a non-convolutional neural network, and effectively functions as a non-recursive (non-feedback) filter.

Consequently, the combination of the CNN feature extractor 148 and the feedforward neural network 156 often can render a result faster than a conventional neural network such as a single-shot detector (SSD) CNN having both an object detector and a feature extractor (also called a classifier).

Referring to FIGS. 6-8, during training of the feedforward neural networks 156, the image-analysis subsystem 70 provides a training image 140 to the already-trained CNN feature extractor 148, which generates, for each object in the training image, an indication as to what cluster the object belongs. In more detail, the subsystem 70 may provide to the feature extractor 148 only the segments (e.g., the two-dimensional arrays of pixels) of the training image 140 including the respective objects, and may provide these segments to the feature extractor one image segment at a time.

Next, for each object in the training image 140, the CNN feature extractor 148 generates an indication of the cluster to which the object belongs. As stated above, this indication may include a vector of confidence levels, one confidence level per cluster. The cluster having the highest confidence level above a threshold is the cluster to which the feature extractor 148 indicates the object belongs.

Then, the image-analysis subsystem 70 provides the image segment for the object to the feedforward neural network 156 configured for the cluster to which the feature extractor 148 indicated the object belongs, for the purpose of training that particular feedforward neural network.

The image-analysis subsystem 70 repeats the above steps for each object in the training image 140.

Next, the image-analysis subsystem repeats the above steps with additional training images 140 until all of the feedforward neural networks 156 are trained.

Referring again to FIGS. 6-7, the image-analysis subsystem 70 also trains a single-shot-detector (SSD) neural network (NN) model 162, which is disposed on (e.g., run, implemented, or executed by) the image-capture subsystem 90, according to an embodiment. The subsystem 70 may train the SSD model 162 before (not shown in FIGS. 6-7) or after (shown in FIGS. 6-7) the image-capture subsystem 90 downloads the SSD model software that the computing circuitry 92 (FIG. 5) executes to implement the SSD model. Furthermore, the computing circuitry 72 (FIG. 4) of the image-analysis subsystem 70 may train the SSD NN model 162 by executing neural network training software 154, which implements a back-propagation training algorithm that can be conventional.

In general, a conventional SSD CNN includes an object-detector front end, and an object-classifier back end.

Because the neural networks 150 effectively perform object feature detection and classification, in an embodiment the image-capture-and-analysis system 122 does not need the SSD NN model 162 to classify objects.

Therefore, in an embodiment, the SSD model 162 includes only an object-detector front end, and omits an object-classifier back end. Alternatively, the SSD NN model 162 includes an object-classifier back end but the image-capture-and-analysis system 122 effectively ignores object classifications that the SSD NN model generates. Or, the system 122 can feed the classifications from the SSD NN model 162 to the CNN feature extractor 148 (FIG. 8), which can accept the SSD NN model classifications as inputs.

During training of the SSD NN model 162, the neural net training software 154 receives, from the data base 144, the clusters, categories, or both the clusters and categories 164 of the objects that the SSD NN model 162 is to be configured to detect. For example, if the objects are furniture items, then the software 154 receives the categories 164 (e.g., sofa, chair, table) of the furniture items that the SSD NN model 162 is being trained to detect. Consequently, the training software 154 does not train the SSD NN model 162 to detect objects (e.g., windows) that do not fall into one of the categories (clusters) 164.

The object-detector front end of the SSD NN model 162 detects, in a conventional manner, the one or more objects in a training image (only the objects that fall into the categories 164), and generates representations of bounding boxes (e.g., similar to the bounding boxes 32, 34, and 36 of FIG. 2) for each detected object.

The image-analysis subsystem 70 continues feeding training images 140 to the SSD NN model 162 until the SSD NN model is trained to detect, and to generate bounding boxes for, objects belonging to all clusters of the cluster hierarchy 146 and categories 164, and is trained to perform such detecting and generating within a range of error suitable for the application (e.g., detecting and identifying items of furniture) for which the image-capture-and-analysis system 122 is, or is being, configured.

Still referring to FIGS. 6-8, alternate embodiments of the training of neural networks of the image-capture-and-analysis system 122 are contemplated. For example, the system 122 can train its neural networks with conventional training images (i.e., images captured of actual spaces with actual objects in the spaces, and manually marked up with bounding boxes, metadata, etc.).

Referring again to FIGS. 6-8, the structure and operation of the image-capture-and-analysis system 122 is described while the system is capturing and analyzing images of objects, according to an embodiment.

First, a user of the image-capture subsystem 90 captures, with a camera or other image-capture device 96, an image of a region of a space that includes one or more objects such as items of furniture. An example of such an image and a space is the image 10 and space 12 of FIG. 1. The image-capture subsystem 90 can be, for example, a smart phone or tablet.

Next, the computing circuitry 72 provides the captured image for display on the display device 100. For example, the display device 100 can be a display screen of a smart phone or tablet.

Then, the SSD NN model 162 detects, within the image, one or more objects that the SSD NN model has been trained to detect. For example, the SSD NN model 162 is trained to detect, and does detect, one or more items of furniture in the image.

The SSD NN model 162 also generates a representation of a respective bounding box for each detected object. The representation may include a location of the bounding box within the image, and the dimensions (e.g., width and length) of the bounding box. As described above, a bounding box bounds a segment of the image that includes some or all of the pixels that form the detected object. An example of a bounding box is the bounding box 36 of FIG. 2.

Then, the computing circuitry 92 (FIG. 5) executing instructions of a software application, here software from a software developer kit (SDK) 170, extracts, from the image, the one or more image segments 172 respectively bounded by the one or more bounding boxes that the SSD NN model 162 generated. As described above, each image segment 172 includes pixels (e.g., numerical representations of the pixels) that form an image representation of a respective detected object.

The SDK 170 also generates image representations of the one or more bounding boxes, sends these image representations to the display 100 such that the displayed bounding boxes overlay the displayed image, and such that each bounding box bounds at least a portion of a respective object in the image, for example as shown in, and described in conjunction with, FIGS. 2-3.

Next, the SDK 170 provides each of the one or more image segments 172 to a neural net inferencing service 174 via the ports 94 (FIG. 5) and 74 (FIG. 4) and a communication network 84 such as the internet or a cellular network. The computing circuitry 72 (FIG. 4) implements the neural net inferencing service 174, for example, by executing respective software code.

Then, the neural net inferencing service 174 reshapes each of the image segments 172 to a common set of dimensions that is compatible with the CNN feature extractor 148. Because the CNN feature extractor 148 has a fixed number of neurons in its first layer, it "expects" to receive an image segment of particular dimensions. For example, the CNN feature extractor 148 may be configured to receive a vector of 2500 pixels generated from a 50 pixel×50 pixel image segment. Therefore, if an image segment 172 has dimensions other than 50 pixels×50 pixels, then the inferencing service 174 converts the image segment 172 into a corresponding reshaped image segment 176 having dimensions of 50 pixels×50 pixels. For example, the inferencing service 174 can use conventional interpolation or extrapolation techniques, in two dimensions, to perform such a conversion. Although an example of a reshaped image segment 176 is described as having dimensions of 50 pixels×50 pixels, the reshaped image segment can have a shape other than square, and can have any suitable size in either of its two dimensions.

Next, the inferencing service 174 provides the reshaped image segments 176, one at a time, to the CNN feature extractor 148.

Then, the CNN feature extractor 148 generates, for a reshaped image segment 176, a respective set of confidence values for the clusters that the CNN feature extractor is trained to detect (e.g., the clusters in the hierarchy of clusters 146).

Next, the neural net inferencing service 174 identifies the cluster to which the object represented by the reshaped image segment 176 belongs as the cluster corresponding to the highest confidence value over a threshold confidence value.

Then, the inferencing service 174 effectively "swaps in," or "activates," the feedforward network 156 trained for the identified cluster. That is, the inferencing service 174 provides the reshaped image segment 172 to the one of the feedforward networks 156 that is configured to determine a category and other descriptors for objects belonging to the identified cluster. Using a respective feedforward network 156 for objects belonging to each cluster increases the speed at which the image-analysis subsystem 72 can generate the category and descriptors for a detected object as compared to using a single, more complex, neural network for all objects.

Next, the activated feedforward network 156 analyzes the reshaped image segment 176 and, in response to the reshaped image segment, generates the category and one or more other descriptors for the object represented by the analyzed reshaped image segment. Each neural network 158 in the bottom layer 160 of the feedforward neural network 156 corresponds to a respective descriptor for the object, and generates a respective confidence value 178 for each of one or more addresses in the database 152 that store descriptor values for the respective descriptors; the address having the highest confidence value above a threshold is typically the address holding the correct value of the descriptor and, therefore, is typically the address that the neural network 156 determines for the corresponding respective descriptor. Further in example, if a neural network 158 in the bottom layer 160 corresponds to the descriptor "color" and the feedforward neural network 156 determines that the color of the object is likely blue, then the neural network 158 in the bottom layer 160 generates a highest confidence value for an address of the database 152 in which is stored a value representing the color blue.

The inferencing service 174 receives the database addresses from the feedforward neural network 156, and downloads, from the database 152, the contents of these addresses, as well as the descriptors for all of the objects used for training the neural network 156.

Then, the inferencing service 174 determines whether the detected object corresponding to the reshaped image segment 176 analyzed by the feedforward neural network 156 is the same as one of the training objects. The inferencing service 174 makes this determination by comparing, using a conventional comparison algorithm, the descriptor values for the training objects to the descriptor values that the feedforward neural network 156 returned for the detected object. If the descriptor values for the detected object match the descriptor values for one of the training objects, then the inferencing service 174 identifies the detected object as being the same as the corresponding training object. For example, if the corresponding training object is a bunkbed from a particular manufacturer and with a particular SKU, then the inferencing service 174 identifies the detected object as being the same bunkbed from the same manufacturer and having the same SKU.

If the inferencing service 174 determines that the detected object is likely the same as one of the training objects, then the inferencing services provides, to the image-capture subsystem 90 via the ports 74 (FIG. 4) and 94 (FIG. 5) and the communication network 84 (FIGS. 4-5) such as the internet or a cellular network, an object identifier that includes, for example, the likely manufacturer and the likely SKU of the detected object. The inferencing service 174 may also provide, to the image-capture subsystem 90 via the ports 74 and 94 and the communication network 84, a list of the likely descriptors for the detected object. An example of such a list is the list 58 of FIG. 3.

If, however, the inferencing service 174 determines that the detected object is unlikely to be the same as one of the training objects, then the inferencing service provides, to the image-capture subsystem 90 via the ports 74 (FIG. 4) and 94 (FIG. 5) and the communication network 84 (FIGS. 4-5), a list of the likely descriptors for the detected object. An example of such a list is the list 58 of FIG. 3.

The inferencing service 174 may also save 180 the object identifier, the list of likely descriptors, or both the object identifier and the list of likely descriptors in the database 152 for later reference. For example, as described above, if the detected object is an item of furniture, then the image-analysis subsystem 70 may perform an internet search for items of furniture having one or more descriptors that are similar to the stored (in the database 152) likely descriptors of the detected object.

In response to either or both of the object identifier and the list of likely descriptors from the inferencing service 174, the SDK 170 generates an image representation of one or both of the object identifier and the list, and provides the image representation to the display device 100, which effectively overlays the image representation onto the image. FIG. 3 is an example of a list 58 of descriptors overlaying an image 50. Furthermore, the SDK 170 may also overlay the boundary box for the detected object onto the image displayed by the display device 100.

The inferencing service 174, neural network 150, and SDK 170 repeat the above object-detection procedure for each of the remaining image segments 172 in the image.

And the camera 96, SSD NN model 162, SDK 170, inferencing service 174, and neural network 150 repeat the above image-capture-and-object-detection procedure for each subsequent image, regardless of whether the subsequent image is a still image or is part of a sequence of video images.

Referring to FIGS. 6-7, the SDK 170 may also generate, and maintain, a "point cloud" (i.e., a three-dimensional map) of the space (e.g., the space 12 of FIGS. 1-3) and of the detected objects within the space at a particular scale factor, such as the relative scale factor of the initial image.

From the relative locations, within an initial captured image, of the bounding boxes generated by the SSD NN model 162, the SDK 170 generates an initial version of the point cloud, which includes the detected objects respectively corresponding to the bounding boxes.

The SDK 170 also tracks the movement of the camera 96, for example, in response to an accelerometer (not shown in FIGS. 6-7) or other sensor (also not shown in FIGS. 6-7) that can measure and indicate camera movement, and tracks the zoom setting of the camera (if the camera has a zoom setting). The SDK 170 can use a conventional algorithm to track the camera movement in response to one or more sensor signals from one or more of the sensors, and can receive the zoom setting from the camera 96 if the camera has a zoom setting.

From the relative locations, within a subsequent captured image, of the bounding boxes generated by the SSD NN model 162, from the camera-movement information, and from the camera zoom setting, the SDK 170 updates the point cloud. For example, if the camera 96 moves out from the space, or zooms out, the objects in the space appear smaller, and more objects may enter the subsequent image. By tracking the camera movement and zoom setting, the SDK 170 can determine, for each detected object in the subsequent image, whether the object is the same as, or is different from, an object already in the point cloud. Consequently, the SDK 170 adds truly new objects to the point cloud, and is less likely to add "false" (already existing) objects to different locations in the point cloud due to mistaking an object already represented in the point cloud for a new object.

The SDK 170 further generates a geometric centroid for each object in the point cloud.

The SDK 170 can provide the point cloud to the image-analysis subsystem 70 via the ports 94 (FIG. 5) and 74 (FIG. 4) and a communication network 84 (FIGS. 4-5), and the image-analysis subsystem 70 can use the point cloud to perform operations such as to propose furniture items and arrangements for the space represented by the point cloud.

The SDK 170 can also use the point cloud in a situation in which the neural net inferencing service 174 does not provide an object identifier or object descriptors corresponding to a video image captured by the camera 96 until after the corresponding image is no longer displayed by the display device 100. Assume that a subsequent captured image currently displayed by the display device 100 also includes the object, but at a different location. By tracking movement and zoom of the camera 96, the SDK 170 can determine which detected object in the subsequent image corresponds to the object in the point cloud that also corresponds to the received object identifier or object descriptors, can generate an image representation of the object identifier, object descriptors, or both object identifier and descriptors, and can overlay the image representation anchored to the corresponding detected object in the currently displayed image.

Referring again to FIGS. 6-8, alternate embodiments of the image-capture-and-analysis system 122, and its functions and operation, are contemplated. For example, the system 122 may perform some or all of the above-described functions and operations with types of images other than light images; examples of such other images include sound images (e.g., sonograms), thermal images, vibration images, and infrared images. Furthermore, although described as detecting and analyzing items of furniture in images, the system 122 can be configured to detect and to analyze any other types of objects in images.

Figure 9:
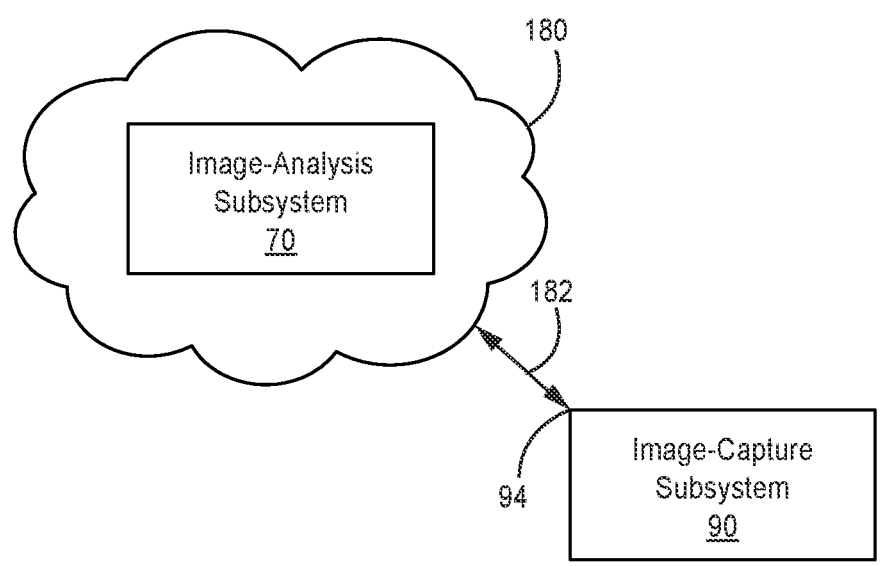
FIG. 9 is a diagram of the image-analysis-and-capture system where the image-analysis subsystem resides in the cloud, according to an embodiment.

FIG. 9 is a diagram of the image-analysis-and-capture system 122 where the image-analysis subsystem 70 and the image-capture subsystem 90 are remote from one another, and the image-analysis subsystem resides in the "cloud" 180 on one or more "cloud" servers, according to an embodiment. The subsystems 70 and 90 communicate with one another via the port 94 and a communication network 182 such as the internet. The connection between the network 182 and the port 94 can be any type of conventional connection, such as a wired (e.g., Ethernet) or wireless (e.g., BlueTooth®, Wi-Fi®) connection. Furthermore, one or more components, such as one or more routers, may be disposed between the port 94 and the network 182.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated. In addition, a described component or operation may be implemented/performed in hardware, in a circuit that executes software, in a circuit that is configured with firmware, or a combination of any two or more of hardware, circuit that executes software, and circuit that is configured with firmware. Furthermore, one or more components of a described apparatus or system may have been omitted from the description for clarity or another reason. Moreover, one or more components of a described apparatus or system that have been included in the description may be omitted from the apparatus or system.

Example 1 includes an image-capture subsystem, comprising: an image-capture device configured to capture a first image of a region of space that includes an object; and computing circuitry coupled to the image-capture device and configured to detect a representation of the object in the first image, to determine a representation of a boundary of the detected representation, to provide image information corresponding to the detected representation to an image-analysis system, to receive, from the image-analysis system, an identifier of a category to which the object belongs, and a descriptor of the object, and to generate a representation of a list that includes the identifier and the descriptor.

Example 2 includes the image-capture subsystem of Example 1 wherein the image-capture device includes a camera configured to capture a video sequence of images, the video sequence including the first image.

Example 3 includes the image-capture subsystem of any of Examples 1-2 wherein the computing circuitry is configured to implement a single-shot-detector convolutional neural network: to detect the representation of the object in the first image; and to determine a representation of a boundary of the detected representation.

Example 4 includes the image-capture subsystem of any of Examples 1-3, further comprising a display device coupled to the computing circuitry and configured: to display the first image; and to display the boundary and the list over the displayed first image.

Example 5 includes the image-capture subsystem of any of Examples 1-4, further comprising: wherein the image-capture device is configured to capture a second image of the region, the second image being subsequent to the first image; and a display device coupled to the computing circuitry and configured to display the second image; and to display the boundary and the list over the displayed second image.

Example 6 includes the image-capture subsystem of any of Examples 1-5 wherein the computing circuitry is configured to generate a representation of the region of space in response to the first image.

Example 7 includes the image-capture subsystem of any of Examples 1-6, further comprising: wherein the image-capture device is configured to capture a second image of the region, the second image being subsequent to the first image; and wherein the computing circuitry is configured to generate a representation of the region of space in response to the first and second images.

Example 8 includes an image-analysis subsystem, comprising: computing circuitry configured to receive a portion of an image, the portion representing an object, and to implement a tree of neural networks configured to determine, in response to the portion of the image, a category and a descriptor corresponding to the object.

Example 9 includes the image-analysis subsystem of Example 8 wherein the computing circuitry is configured to receive the portion of the image from an image-capture system.

Example 10 includes the image-analysis subsystem of any of Examples 8-9 wherein each of the neural networks includes a respective feed-forward neural network.

Example 11 includes the image-analysis subsystem of any of Examples 8-10 wherein the computing circuitry is configured to implement the neural networks such that the neural networks are configured to identify the object in response to the portion of the image.

Example 12 includes the image-analysis subsystem of any of Examples 8-11 wherein the computing circuitry is configured to implement the neural networks such that the neural networks are configured to determine, in response to the portion of the image, a stock-keeper's unit for the object.

Example 13 includes the image-capture subsystem of any of Examples 8-12 wherein the computing circuitry is configured: to receive the portion of the image from an image-capture system; and to provide a name of the category, and the descriptor, to the image-capture system.

Example 14 includes a system, comprising: first computing circuitry configured to detect a representation of an object in a first image; and second computing circuitry configured to determine, in response to image information corresponding to the detected representation, a category to which the object belongs, and a descriptor of the object.

Example 15 includes the system of Example 14 wherein the first computing circuitry is configured to implement a single-shot-detector convolutional neural network to detect the representation of an object.

Example 16 includes the system of any of Examples 14-15 wherein the image information describes pixels that form the detected representation of the object.

Example 17 includes the system of any of Examples 14-16 wherein the second computing circuitry is configured to implement feed-forward neural networks to determine the category to which the object belongs and the descriptor of the object.

Example 18 includes the system of any of Examples 14-17, further comprising: a display device; wherein the second computing circuitry is configured to provide an identifier of the category and the descriptor to the first computing circuitry; and wherein the first computing circuitry is configured to cause the display to display a combination of the first image and a list that includes the identifier and the descriptor.

Example 19 includes the system of any of Examples 14-18 wherein: the first computing circuitry is configured to determine a boundary of the detected representation of the object; the second computing circuitry is configured to provide an identifier of the category and to provide the descriptor to the first computing circuitry; and the first computing circuitry is configured to generate a representation of a second image that includes, the detected representation of the object; a representation of the determined boundary; and a representation of a list corresponding to the detected representation of the object and including the identifier and the descriptor.

Example 20 includes the system of any of Examples 14-19, further comprising: a display device; wherein the second computing circuitry is configured to provide an identifier of the category, and the descriptor, to the first computing circuitry; and wherein the first computing circuitry is configured to determine a boundary of the detected representation of the object, to generate a representation of the determined boundary, to generate a representation of a list corresponding to the detected representation of the object and including the identifier and the descriptor, and to cause the display device to display the first image and to display, over the first image, the determined boundary and the list.

Example 21 includes a method, comprising: detecting a first representation of an object in a first image; and determining, in response to image information corresponding to the detected first representation, a category to which the object belongs, and a descriptor of the object.

Example 22 includes the method of Example 21 wherein detecting includes detecting a representation of an object using a neural network.

Example 23 includes the method of any of Examples 21-22 wherein detecting includes detecting a representation of an object using a single-shot-detector convolutional neural network.

Example 24 includes the method of any of Examples 21-23 wherein the image information includes information describing pixels that form the detected representation of the object.

Example 25 includes the method of any of Examples 21-24 wherein the image information includes a pixel map of the detected representation of the object.

Example 26 includes the method of any of Examples 21-25 wherein determining includes determining the category to which the object belongs and the descriptor of the object using neural networks.

Example 27 includes the method of any of Examples 21-26 wherein determining includes determining the category to which the object belongs and the descriptor of the object using feed-forward neural networks.

Example 28 includes the method of any of Examples 21-27, further comprising generating a representation of the first image that includes: the first representation of the object; and a list corresponding to the detected first representation of the object and including the determined category and the determined descriptor.

Example 29 includes the method of any of Examples 21-28, further comprising: capturing a second image of the object; detecting a second representation of the object in the second image; and generating a representation of the second image that includes the second representation of the object; and a list corresponding to the detected first representation of the object and including the determined category and the determined descriptor.

Example 30 includes the method of any of Examples 21-29, further comprising: determining a boundary of the detected first representation of the object; and generating a representation of the first image that includes, the detected first representation of the object, a representation of the determined boundary, and a representation of a list corresponding to the detected first representation of the object and including the determined category and the determined descriptor.

Example 31 includes the method of any of Examples 21-30, further comprising: determining a boundary of the detected first representation of the object; capturing a second image of the object; detecting a second representation of the object in the second image; and generating a representation of the second image that includes, the detected second representation of the object, a representation of the determined boundary, and a representation of a list corresponding to the detected first representation of the object and including the determined category and the determined descriptor.

Example 32 includes the method of any of Examples 21-31, further comprising: determining a boundary of the detected first representation of the object; generating a representation of the determined boundary; generating a representation of a list corresponding to the detected first representation of the object and including the determined category and the determined at least one descriptor; displaying the first image; and displaying over the first image the determined boundary and the list.

Example 33 includes the method of any of Examples 21-32, further comprising: determining a boundary of the detected first representation of the object; generating a representation of the determined boundary; capturing a second image of the object; detecting a second representation of the object in the second image; generating a representation of a list corresponding to the detected first representation of the object and including the determined category and the determined at least one descriptor; displaying the second image; and displaying over the second image the determined boundary and the list.

Example 34 includes the method of any of Examples 21-33, further comprising: generating, in response to the first image and the detected representation of the object, a three-dimensional representation of the region including the object; detecting a representation of an object in a second image of the region of space subsequent to the first image; determining a relative distance between the representation of the object in the first image and the representation of the object in the second image; determining whether the object in the first image is the same object in the second image in response to the relative distance; updating the three-dimensional representation of the region in a first manner if the object in the first image is determined to be the same as the object in the second image; and updating the three-dimensional representation of the region in a second manner if the object in the first image is determined to be different from the object in the second image.

Example 35 includes the method of any of Examples 21-34 wherein the object includes an item of furniture.

Example 36 includes a method, comprising: capturing a first image of a region of space that includes an object; detecting a representation of the object in the first image; determining a representation of a boundary of the detected representation; providing image information corresponding to the detected representation to an image-analysis system; receiving, from the image-analysis system, an identifier of a category to which the object belongs, and a descriptor of the object; and generating a representation of a list that includes the identifier and the descriptor.

Example 37 includes a method, comprising: receiving a portion of an image, the portion representing an object; and implementing a tree of neural networks configured to determine, in response to the portion of the image, a category and a descriptor corresponding to the object.

Example 38 includes a non-transitory computer-readable medium storing instructions that, when executed by one or more computing circuits, cause the one or more computing circuits, or one or more other circuits under control of the one or more computing circuits: to detect a first representation of an object in a first image; and to determine, in response to image information corresponding to the detected first representation, a category to which the object belongs, and a descriptor of the object.

Example 39 includes a non-transitory computer-readable medium storing instructions that, when executed by one or more computing circuits, cause the one or more computing circuits, or one or more other circuits under control of the one or more computing circuits: to capture a first image of a region of space that includes an object; to detect a representation of the object in the first image; to determine a representation of a boundary of the detected representation; to provide image information corresponding to the detected representation to an image-analysis system; to receive, from the image-analysis system, an identifier of a category to which the object belongs, and a descriptor of the object; and to generate a representation of a list that includes the identifier and the descriptor.

Example 40 includes a non-transitory computer-readable medium storing instructions that, when executed by one or more computing circuits, cause the one or more computing circuits, or one or more other circuits under control of the one or more computing circuits: to receive a portion of an image, the portion representing an object; and to implement a tree of neural networks configured to determine, in response to the portion of the image, a category and a descriptor corresponding to the object.

Example 41 includes a method, comprising: generating respective image segments of each of one or more objects in response to respective electronic representations of the one or more objects; combining a respective image segment of each of at least one of the one or more objects with an image of a space to generate a first combined image; changing at least one parameter of the first combined image to generate a second combined image; and training at least one neural network with the first and second combined images.

Example 42 includes the method of Example 41 wherein at least two of the respective image segments of one of the one or more objects represent respective orientations of the one of the one or more objects.

Example 43 includes the method of any of Examples 41-42 wherein at least two of the respective image segments of one of the one or more objects represent respective textures of the one of the one or more objects.

Example 44 includes the method of any of Examples 41-43 wherein at least one of the respective electronic representations includes an electronic drawing file for the corresponding object.

Example 45 includes the method of any of Examples 41-44 wherein at least one of the respective electronic representations includes an electronic computer-aided-design file for the corresponding object.

Example 46 includes the method of any of Examples 41-45 wherein the image of the space includes a high-dynamic-range image of the space.

Example 47 includes the method of any of Examples 41-46 wherein the at least one parameter includes a lighting condition of the combined image, the lighting condition including at least one of a lighting-source location, a lighting intensity, a lighting pattern, and a number of lighting sources.

Example 48 includes the method of any of Examples 41-47 wherein the at least one parameter includes a camera condition of the combined image, the camera condition including at least one of a camera angle, camera zoom, f-stop, color balance, contrast, focus, and color temperature.

Example 49 includes the method of any of Examples 41-48 wherein the at least one neural network includes a convolutional-neural-network feature detector.

Example 50 includes the method of any of Examples 41-49 wherein the at least one neural network includes a single-shot-detector.

Example 51 includes the method of any of Examples 41-50 wherein the at least one neural network includes a feedforward neural network.

The invention claimed is:

1. A method for generating at least one synthetic training image, the method comprising:
   receiving an image;
   receiving at least one three-dimensional representation of an object;
   implementing, using a rendering engine, at least one instruction for altering at least one parameter of the at least one three-dimensional representation of the object;
   generating at least one synthetic training image that includes at least the altered parameter of the three-dimensional representation of the object;
   associating metadata with the at least one synthetic training image;
   populating the image with the synthetic training image that includes at least the altered parameter of the three-dimensional representation of the object;
   generating a second synthetic training image using at least the populated image; and
   storing the associated metadata and the second synthetic training image in memory.

2. The method of claim 1, wherein the three-dimensional representation of an object is at least one of a computer-aided-design (CAD) electronic file, a point cloud, or a portion of a first synthetic training image.

3. The method of claim 1, wherein altering at least one parameter comprises adjusting at least one lighting condition of the three-dimensional representation of the object.

4. The method of claim 1, wherein altering at least one parameter comprises adjusting a sensor parameter.

5. The method of claim 4, wherein the adjusting the sensor parameter includes altering at least one of a light, sound, infrared, or thermal parameter.

6. The method of claim 1, wherein altering at least one parameter comprises adjusting an orientation of the three-dimensional representation of the object.

7. The method of claim 5, further comprising creating a two-dimensional representation of the three-dimensional representation of the object having an adjusted orientation.

8. The method of claim 4, wherein the adjusting the sensor parameter replicates a camera condition, the camera condition including at least one of a camera angle, a resolution, a bit depth, a dynamic range, a camera zoom, f-stop, color balance, contrast, focus, and color temperature.

9. The method of claim 1, wherein the at least one instruction for altering the at least one parameter alters one or more of a space between the object and a second object, a number of objects within a space, an object orientation, a lighting condition, a texture of the object, and a feature of the object.

10. The method of claim 1, further comprising:
   a. storing the associated metadata and the at least one synthetic training image using at least the populated image in memory.

11. The method of claim 1, wherein the received image is at least one of a still image, a sequence of images, a satellite image, or a high-dynamic-range (HDR) image.

12. The method of claim 1, wherein generating the second synthetic training image further comprises:
   a. receiving at least one sensor condition; and b. adjusting at least one image parameter based at least in part on the received at least one sensor condition.

13. The method of claim 1, further comprising:
   a. implementing at least one instruction for altering at least one parameter of the at least one three-dimensional representation of the object of the at least one synthetic training image to generate at least one second synthetic training image;
   b. associating metadata with the at least one second synthetic training image;
   c. storing the associated metadata and the at least one second synthetic training image in memory; and
   d. training at least one neural network to recognize at least one portion of the object using the at least one synthetic training image and the at least one second synthetic training image.

14. The method of claim 13, wherein the at least one altered parameter is a texture of the first synthetic training image.

15. The method of claim 13, wherein the at least one altered parameter includes at least one lighting condition of the first synthetic training image.

16. The method of claim 13, wherein the at least one altered parameter includes at least one camera condition of the synthetic training image.

17. The method of claim 13, wherein implementing the at least one instruction generates a substantially random set of statistically independent parameters of the object.

18. The method of claim 17, wherein the at least one instruction includes at least a user input.

19. The method of claim 13, wherein generating the at least one second synthetic training image includes applying a texture map to the object.

20. The method of claim 1, wherein the associated metadata further comprises a category, a common category, one or more descriptors, an object identifier, a list of objects within the first synthetic training image, a pixel map, or an object pairing.

21. A method for randomly generating a plurality of synthetic training images, the method comprising:
   receiving an image;
   receiving at least one three-dimensional representation of an object;
   implementing at least one instruction for altering one or more parameters of the at least one three-dimensional representation of the object;
   generating at least one synthetic training image that includes at least the altered parameter of the three-dimensional representation of the object, wherein the at least one synthetic training image includes a statistically independent spread of the one or more parameters amongst the plurality of synthetic training images;
   associating metadata with the at least one synthetic training image; populating the image with the synthetic training image that includes at least the altered parameter of the three-dimensional representation of the object; and
   generating a second synthetic training image using at least the populated image receiving at least one three-dimensional representation of an object; and
   storing the associated metadata and the second synthetic training image in memory.

22. The method of claim 21, wherein the associating metadata further comprises extracting the metadata from at least one of a list, embedded metadata within a file containing the at least one three-dimensional representation of the object, or metadata from a server.

23. The method of claim 21, further comprising:
   receiving image data relating to the at least one three-dimensional representation of the object;
   altering at least one parameter of the image data relating to the at least one three-dimensional representation of the object;
   generating at least one synthetic image that includes at least the altered parameter of the image data relating to the at least one object; and
   associating metadata with the at least one synthetic image.

24. The method of claim 21, wherein the received image is at least one of a still image, a sequence of images, a satellite image, or a high-dynamic-range (HDR) image.

25. The method of claim 21, further comprising receiving image information including one or more of: a category of at least one object within the image, at least one descriptor of the at least one object within the image, an identifier, or sensor information of the received image.

26. The method of claim 21, further comprising training at least one neural network to recognize at least one portion of the object using at least the first synthetic training image.

27. The method of claim 21, wherein the at least one neural network further performs a grouping action of at least one object in a plurality of synthetic training images into at least one hierarchal cluster.

* * * * *